US012754434B1

(12) United States Patent
Hamer et al.

(10) Patent No.: US 12,754,434 B1
(45) Date of Patent: Oct. 6, 2026

(54) AUGMENTED REALITY SYSTEM USING DISPLAY WITH FIBER-OPTIC FACEPLATE

(71) Applicant: OLEDWorks LLC, Rochester, NY (US)

(72) Inventors: John Hamer, Rochester, NY (US); Aaron Bauer, Penfield, NY (US)

(73) Assignee: OLEDWorks LLC, Rochester, NY (US)

( * ) Notice: Subject to any disclaimer, the term of this patent is extended or adjusted under 35 U.S.C. 154(b) by 0 days.

(21) Appl. No.: 19/327,167

(22) Filed: Sep. 12, 2025

(51) Int. Cl.

| | |
|---|---|
| ***G02B 27/01*** | (2006.01) |
| ***H04N 13/344*** | (2018.01) |
| ***H04N 13/346*** | (2018.01) |
| ***H10K 59/35*** | (2023.01) |
| ***H10K 59/38*** | (2023.01) |

(52) U.S. Cl.
CPC ..... *G02B 27/0172* (2013.01); *G02B 27/0176* (2013.01); *H04N 13/344* (2018.05); *H04N 13/346* (2018.05); *H10K 59/35* (2023.02); *H10K 59/38* (2023.02); *G02B 2027/011* (2013.01); *G02B 2027/013* (2013.01); *G02B 2027/0152* (2013.01)

(58) Field of Classification Search
CPC ............ G02B 27/0172; G02B 27/0176; G02B 2027/011; G02B 2027/013; G02B 2027/0152; H04N 13/344; H04N 13/346; H10K 59/35; H10K 59/38
See application file for complete search history.

(56) References Cited

U.S. PATENT DOCUMENTS

| | | | |
|---|---|---|---|
| 4,799,765 | A | 1/1989 | Ferrer |
| 5,131,065 | A | 7/1992 | Briggs et al. |

(Continued)

FOREIGN PATENT DOCUMENTS

| | | |
|---|---|---|
| DE | 10 2021 123037 A1 | 3/2023 |

OTHER PUBLICATIONS

O. Cakmakci et al., "Optimal local shape description for rotationally non-symmetric optical surface design and analysis" Optics Express, 16(3), 1583 (2008).

(Continued)

*Primary Examiner* — Premal R Patel

(57) ABSTRACT

A binocular head-mounted augmented reality system comprising two identical display units, each with a pixelated display with a width of the emitting area in the range of 30 to 45 mm and a height in the range of 25 to less than 40 mm, and a pixel pitch in the range of 15-50 μm, where each display has a planar emissive surface in direct optical contact with a fiber optic faceplate so that an image emitted by the display passes through the faceplate and is emitted at a curved surface on the opposite end of the faceplate; and a curved semi-transparent visor having two reflective sections arranged to reflect the emitted image from each display unit towards the eyes so that the reflected images are combined into a single viewed image along with external light passing through the visor; and wherein the reflective sections each have a freeform surface whose surface elevations from a base plane change symmetrically on either side of a center line that runs through a center point in a first direction but changes asymmetrically on either side of a center line through the same center point in a second direction which is orthogonal to the first direction.

20 Claims, 22 Drawing Sheets

(56) References Cited

U.S. PATENT DOCUMENTS

| | | | | | |
|---|---|---|---|---|---|
| 5,260,815 | A | | 11/1993 | Takizawa | |
| 5,309,169 | A | * | 5/1994 | Lippert | G02B 27/0172 359/14 |
| 5,329,386 | A | | 7/1994 | Birecki et al. | |
| 6,522,474 | B2 | | 2/2003 | Cobb et al. | |
| 6,892,014 | B2 | | 5/2005 | Cok et al. | |
| 8,094,377 | B2 | | 1/2012 | Kessler et al. | |
| 10,048,532 | B2 | | 8/2018 | Powell et al. | |
| 10,088,681 | B2 | | 10/2018 | Rolland et al. | |
| 10,345,517 | B2 | | 7/2019 | Richards | |
| 10,928,633 | B1 | | 2/2021 | Yuan et al. | |
| 11,624,912 | B2 | | 4/2023 | Rolland et al. | |
| 2004/0108806 | A1 | | 6/2004 | Cok et al. | |
| 2007/0237515 | A1 | | 10/2007 | Wahlstrom | |
| 2010/0214635 | A1 | * | 8/2010 | Sasaki | G02B 27/0101 359/619 |
| 2012/0154920 | A1 | * | 6/2012 | Harrison | G02B 27/017 359/619 |
| 2013/0155723 | A1 | * | 6/2013 | Coleman | G02B 6/0018 362/621 |
| 2017/0255015 | A1 | | 9/2017 | Geng et al. | |
| 2018/0284441 | A1 | | 10/2018 | Cobb | |
| 2020/0186759 | A1 | * | 6/2020 | Tanaka | H04N 9/31 |
| 2020/0341278 | A1 | * | 10/2020 | Tanaka | G02B 27/0172 |
| 2024/0061256 | A1 | * | 2/2024 | Ikeda | G02B 27/01 |

OTHER PUBLICATIONS

J. Liu et al., "Compact off-axis reflective optical system design combining freeform mirror and freeform detector", Optics Communications, 565, 130675 (2024).

V. Lakshminarayanana and A. Flecka, "Tutorial Review—Zernike polynomials: a guide", Journal of Modern Optics, 58 (7), 545-561 (2011).

M. Nikolic et al,, "Optical design through optimization using freeform orthogonal polynomials for rectangular apertures", Proc. of SPIE, 9626, 96260V-1 (2015).

N. Takaki et al., "On-the-fly surface manufacturability constraints for freeform optical design enabled by orthogonal polynomials", Optics Express, 27(5), 6129 (2019).

2048.101-2023—IEEE Standard for Augmented Reality on Mobile Devices—General Requirements for Software Framework, Components, and Integration as well as Integrated Visual Augmentation System 1.2 development task order for the US Army.

* cited by examiner

| PARAMETER | ZERNIKE POLYNOMIAL | NAME | DISPLAY SURFACE 5B | VISOR SURFACE 9A1/9A2 |
|---|---|---|---|---|
| | | Rbase | -65.21 | -96.043424062 |
| | | Rbest | -79.165 | -99.089288 |
| | | Rnorm | 28 | 36 |
| Z1 | 1 | Piston | -0.035289026 | 0.007545637 |
| Z2 | $\rho \cos(\theta)$ | Tilt X | 0 | 0 |
| Z3 | $\rho \sin(\theta)$ | Tilt Y | 0.496026639 | 0.282478124 |
| Z4 | $2\rho^2 -1$ | Defocus | 0.299165608 | 0.012239001 |
| Z5 | $\rho^2 \cos(2\theta)$ | Astigmatism X | -0.479963803 | -0.305302891 |
| Z6 | $\rho^2 \sin(2\theta)$ | Astigmatism Y | 0 | 0 |
| Z7 | $(3\rho^3 -2\rho) \sin(2\theta)$ | Coma X | 0 | 0 |
| Z8 | $(3\rho^3 -2\rho) \sin(2\theta)$ | Coma Y | 0.24801332 | 0.143339697 |
| Z9 | $6\rho^4 -6\rho^2 +1$ | Primary spherical | 0.569187399 | 0.001943941 |
| Z10 | $\rho^3 \cos(3\theta)$ | Trefoil X | 0 | 0 |
| Z11 | $\rho^3 \sin(3\theta)$ | Trefoil Y | -0.708487444 | 0.020988538 |
| Z12 | $(4\rho^4 -3\rho^2) \cos(2\theta)$ | Secondary X astigmatism | 0 | 0.003474785 |
| Z13 | $(4\rho^4 -3\rho^2) \sin(2\theta)$ | Secondary Y astigmatism | 0 | 0 |
| Z14 | $(10\rho^5 -12\rho^3 +3\rho) \cos(\theta)$ | Secondary X coma | 0 | 0 |
| Z15 | $(10\rho^5 -12\rho^3 +3\rho) \sin(\theta)$ | Secondary Y coma | 0 | -0.001639362 |
| Z16 | $20\rho^6 -30\rho^4 +12\rho^2 -1$ | Secondary spherical | 0.234732765 | -0.004188729 |
| Z17 | $\rho^4 \cos(4\theta)$ | Tetrafoil X | 0 | -0.011344877 |

FIG. 8A

| PARAMETER | ZERNIKE POLYNOMIAL | NAME | DISPLAY SURFACE 5B | VISOR SURFACE 9A1/9A2 |
|---|---|---|---|---|
| Z18 | $\rho^4 \sin(4\theta)$ | Tetrafoil X | 0 | 0 |
| Z19 | $(5\rho^5-4\rho^3) \cos(3\theta)$ | Secondary X trefoil | 0 | 0 |
| Z20 | $(5\rho^5-4\rho^3) \sin(3\theta)$ | Secondary Y trefoil | 0 | 0.009083533 |
| Z21 | $(15\rho^6-20\rho^4+6\rho^2) \cos(2\theta)$ | Tertiary X astigmatism | 0 | 0.003414584 |
| Z22 | $(15\rho^6-20\rho^4+6\rho^2) \sin(2\theta)$ | Tertiary Y astigmatism | 0 | 0 |
| Z23 | $(35\rho^7-60\rho^5+30\rho^3-4\rho) \cos(\theta)$ | Tertiary X coma | 0 | 0 |
| Z24 | $(35\rho^7-60\rho^5+30\rho^3-4\rho) \sin(\theta)$ | Tertiary Y coma | 0 | -0.002152046 |
| Z25 | $70\rho^8-140\rho^6+90\rho^4-20\rho^2+1$ | Tertiary spherical | 0 | -0.000992635 |
| Z26 | $\rho^5 \cos(5\theta)$ | Pentafoil X | 0 | 0 |
| Z27 | $\rho^5 \sin(5\theta)$ | Pentafoil Y | 0 | -0.006539542 |
| Z28 | $(6\rho^6-5\rho^4) \cos(4\theta)$ | Secondary X Tetrafoil | 0 | -0.005250398 |
| Z29 | $(6\rho^6-5\rho^4) \sin(4\theta)$ | Secondary Y Tetrafoil | 0 | 0 |
| Z30 | $(21\rho^7-30\rho^5+10\rho^3) \cos(3\theta)$ | Tertiary X Trefoil | 0 | 0 |
| Z31 | $(21\rho^7-30\rho^5+10\rho^3) \sin(3\theta)$ | Tertiary Y Trefoil | 0 | 0.001240211 |
| Z32 | $(56\rho^8-105\rho^6+60\rho^4-10\rho^2) \cos(2\theta)$ | Quanternary X astigmatism | 0 | 0.000314575 |
| Z33 | $(56\rho^8-105\rho^6+60\rho^4-10\rho^2) \sin(2\theta)$ | Quanternary Y astigmatism | 0 | 0 |
| Z34 | $(126\rho^9-280\rho^7+210\rho^5-60\rho^3+5\rho) \cos(\theta)$ | Quanternary X coma | 0 | 0 |
| Z35 | $(126\rho^9-280\rho^7+210\rho^5-60\rho^3+5\rho) \sin(\theta)$ | Quanternary Y coma | 0 | 0.000102234 |
| Z36 | $252\rho^{10}-630\rho^8+560\rho^6-210\rho^4+30\rho^2-1$ | Quanternary Spherical | 0 | 9.68767E-05 |
| Z37 | $924\rho^{12}-2772\rho^{10}+3150\rho^8-1680\rho^6+420\rho^4-42\rho^2+1$ | | 0 | -0.000349795 |

*FIG. 8B*

AUGMENTED REALITY SYSTEM USING DISPLAY WITH FIBER-OPTIC FACEPLATE

BACKGROUND

Augmented Reality (AR) systems overlay video or images onto a view of the physical world. The overlaid image creates an interaction between the user, the digital, and the physical worlds. In contrast to Virtual Reality (VR), Augmented Reality allows users to maintain control over their physical surroundings, layering digital content seamlessly into the real world. AR users are not transported to a separate environment; instead, they stay grounded in their immediate environment while seeing virtual elements that enhance real-world contexts. This fluid integration lets users engage with digital tools without losing awareness of their physical presence. For example, AR can provide navigational assistance on a busy street while users remain fully aware of their surroundings, creating a balance between immersion and practicality. A practical AR system should provide a wide-angle view of the real world so that objects off to the side or above/below of the direct-line-of sight remain visible. Depending on the application and use, the computer-generated image can cover a wide field-of-view, be restricted to the center of the line-of-sight or be located off to the side of the line-of-sight.

An AR system requires some sort of semi-transparent visor or glasses located in front of the viewer's eye that allows external light to pass through so that the physical world can be seen simultaneously with a computer-generated image. The visor is typically curved in order to provide the necessary wide angle-of-view. In theory, the visor itself could generate the computer image within the same viewing area through which the external light passes, but this approach has many drawbacks. Most AR systems use a separate display that emits a computer image that is projected onto the visor or glasses so that the computer image is reflected towards the viewer's eye by the inside surface of the visor so that the image becomes overlayed and simultaneously viewed with the external light.

To be practical, the AR system should be head mounted so that the wearer can be mobile. This requires that the system be lightweight (typically, no more than 500 g and preferably less than 300 g) and compact. The parts of the AR system that involve the image projection should be mounted substantially within the headgear and not have components that extend out and away from the headgear. Having components that extend too far away from the head will create a torque and fatigue the wearer over time. For example, in a helmet-mounted system, a typical space between the forehead and the edge of a helmet is less than 40 mm. This restricts the overall size of the system and limits the optical pathlengths involved. For AR systems that use a reflected computer image, the image from the display should be seen as clear and sharp. This requires an optical system that prevents or minimizes any optical distortions or aberrations. Moreover, since the system should be lightweight and compact, the number of optical components such as lenses, etc. required for the optical system should be minimized. However, limiting the number of optical components also limits the opportunity to use those components to correct for optical defects. For most applications, the AR system should be binocular; that is, has two separate displays (one for each eye) whose emissions are seamlessly integrated to form a single perceived image. This allows for a visual depth-of-field for the generated image.

One important use of an AR system is for military applications. For these, the visor component of the AR system should not only be lightweight but also physically robust towards breakage and scratches and provides protection to the face. It would be desirable that the visor also be able to be 'flipped-up' so that it is not in the direct line-of-sight, or detachable whenever necessary and easily re-attached or replaced. Because of this, the optical system should be robust towards small misalignments in angle between the emissive display and semi-reflective visor.

Simple systems with one reflective surface where the display is located over the forehead and the image is reflected directly towards the eye have been studied many times. The difficulty with these systems is that there is a limitation to the amount of aberration correction achievable with only one reflective surface. If the optical pathlength is large enough so that the tilt angle of the display is small, then satisfactory visual acuity (e.g. 20/40 vision) of the display could be achieved. This is because as the tilt angle of the display increases, the more the image is blurred and distorted. However, in a case where the system must fit in a small constrained space, the tilt angle for both the display and the reflective visor will be large enough to cause significant optical distortion.

Another motivation for having a small AR system is to reduce power requirements. The power required by the display is proportional to its area and so, a smaller display helps to reduce power requirements to an acceptable level. The brightness of a display can be expressed in terms of the term 'nits,' signifying one candela per square meter. For use in bright daylight, the display brightness needs to be at least 20% and preferably 50% brighter than the ambient background, reaching up to 5,000 nits at the eyes and so luminance of at least 6800 nits, or more preferably 8000 to 10,000 nits at the display (10-20× higher brightness than cell phone displays) would be necessary.

Because of the great interest in this technology, standards have been proposed. For example, see 2048.101-2023—IEEE Standard for Augmented Reality on Mobile Devices—General Requirements for Software Framework, Components, and Integration as well as Integrated Visual Augmentation System 1.2 development task order for the US Army.

Because of the need for a small, lightweight display in AR systems, microdisplays have been typically used. Typically, a microdisplay is defined as being less than two inches diagonally (approx. 5 cm) and, more commonly, one inch or less and down to an ultra-small display size of less than 0.25" diagonal. In most cases, the resolution of the microdisplay is high and the pixel pitch is usually 5 to 15 microns. They also have low power consumption which is important in terms of battery lifetime. However, microdisplays in AR systems typically require magnifying optics.

Microdisplays can be made from a range of display technologies, including Liquid Crystal-On-Silicon (LCoS); Liquid Crystal Displays (LCD); Digital Micromirror Devices (DMD); Digital Light Processing (DLP); and more recently, MicroLED (Light Emitting Diode) and Organic Light Emitting Diode (OLED).

Planar displays such as OLEDs typically produce emitted light that is diffuse and has a large range in terms of direction. It would be desirable to reduce the wide emission angle in the light emitted from the planar display surface so that more light is emitted perpendicular to the surface and less is emitted in an off-axis direction.

An AR device is a focal system; that is, it has a finite focal length so that the light converges at a single point or area. In this case, the display is at the focal point of the optics. The light is collimated at the eye. A relaxed eye is able to focus a collimated beam onto the retina to perceive an image, so the visor's job is to collimate the light from the display and direct it to the eye. To collimate a light source, the light source should be placed at the focal point of the imaging optic (visor). Reflective type planar displays with curved reflective components often suffer from various types of optical aberrations, deficiencies and distortions due to reflection from the nonplanar reflective surfaces. In geometric optics, distortion is a deviation from rectilinear projection; that is, a projection in which straight lines in a scene remain straight in an image or a warping of an otherwise non-blurry image. An aberration is the blurring of an image. These can be corrected, at least in part, using optical lenses and other optical methods, during image processing or by a combination of the two.

Lippert (U.S. Pat. No. 5,309,169) has disclosed a head-mounted AR system where the computer image (generated by a flat display panel) is reflected off the inner surface of a curved semi-transparent visor. The display is mounted at an angle above the helmet. There is a fiber optic faceplate on the emitting surface of the flat display panel where the outer section has an aspherical shaped surface. The visor has an aspheric surface section so that light emitted from the aspherical shaped surface of the fiber optic faceplate display is directed towards the eye of the user. The shapes of the aspherical surfaces of both the fiber optic faceplate and the inner surface of the visor can be light-modelled to correct for distortions and aberrations. Lippert notes that such a system can provide near-zero visual obfuscation in a 20-to-25-degree circular field-of-view. However, this field of view is too small for many applications, particularly military uses.

Yuan et al. (U.S. Pat. No. 10,928,633) describes an AR system with a tilted display and a tilted reflective display.

Kessler et al. (U.S. Pat. No. 8,094,377) describe a binocular head mounted AR system that uses two OLED flat panel displays, each in optical contact with a fiber optic faceplate with a regular convex output surface.

Richards (U.S. Pat. No. 10,345,517 has proposed a head-mounted VR system using a curved display unit with a light-emitting panel. The display may have a fiber optic block with a freeform (aspherical) surface located directly on the emissive surface of a light-emitting panel in order to correct optical distortions and aberrations. The light emitting panel (which may be an OLED) may be flat. Although directed to a VR system where the display is contained entirely within the "visor" with no view of the external world, Richards discloses that the invention may be applied to an AR device but supplies no details.

Cobb et al. (U.S. Pat. No. 6,522,474) describe a binocular head mounted AR system that uses two OLED flat panel displays, each in optical contact with a fiber optic faceplate with a concentric output surface in which a ball lens is located.

Other references that describe the use of a fiber optic faceplates for flat panel displays include: U.S. Pat. Nos. 4,799,765, 5,131,065, 5,260,815, 5,329,386, 6,892,014, 10,048,532, US20040108806, US20070237515, US20170255015, US20180284441 and DE102021123037.

US20200341278 and US20200186759 both describe binocular AR systems where an image from a display is reflected off a curved visor to the eye. The reflecting surface of the visor has an aspherical shape whose curvature in a Y'-Z' plane is smaller than the curvature in an X'-Z' plane.

O. Cakmakci et al., "Optimal local shape description for rotationally non-symmetric optical surface design and analysis", Optics Express, 16(3), 1583 (2008) describes the use of rotationally non-symmetrical optical surfaces.

J. Liu et al., "Compact off-axis reflective optical system design combining freeform mirror and freeform detector", Optics Communications, 565, 130675 (2024) describes methods for designing freeform surfaces.

A common method to model optical surfaces is by the use of Zernike Polynomials. For example, see V. Lakshminarayanana and A. Flecka, "TUTORIAL REVIEW—Zernike polynomials: a guide", Journal of Modern Optics, 58 (7), 545-561 (2011); M. Nikolic et al, "Optical design through optimization using freeform orthogonal polynomials for rectangular apertures", Proc. of SPIE, 9626, 96260V-1 (2015); and N. Takaki et al., "On-the-fly surface manufacturability constraints for freeform optical design enabled by orthogonal polynomials", Optics Express, 27(5), 6129 (2019). Zernike polynomials have been used to mathematically describe the propagation of optical wavefronts. Zernike coefficients are numerical values that represent the magnitude of Zernike polynomials, which are used to describe wavefront shapes and optical aberrations in systems like lenses and mirrors. They help quantify how much each polynomial contributes to the overall wavefront, allowing for precise optical analysis and correction. Zernike polynomials can also be useful in defining the magnitude and characteristics of the differences between the image formed by an optical system and the original object. These optical aberrations can be a result of optical imperfections in the individual elements of an optical system and/or the system as a whole. An optical component with a freeform surface may be parameterized by normalized basis functions such as Zernike sets. For example, see U.S. Pat. Nos. 11,624,912 and 10,088,681.

There continues to be a need for a small, lightweight and robust head-mounted AR system that provides a wide field-of-view at the necessary resolution without optical distortions.

SUMMARY

This need can be satisfied by a binocular head-mounted augmented reality system comprising two identical display units, each with a pixelated display with a width of the emitting area in the range of 30 to 45 mm and a height in the range of 25 to less than 40 mm, and a pixel pitch in the range of 15-50 μm, where each display has a planar emissive surface in direct optical contact with a fiber optic faceplate so that an image emitted by the display passes through the faceplate and is emitted at a curved surface on the opposite end of the faceplate; and a curved semi-transparent visor having two reflective sections arranged to reflect the emitted image from each display unit towards the eyes so that the reflected images are combined into a single viewed image along with external light passing through the visor; and wherein the reflective sections each have a freeform surface whose surface elevations from a base plane change symmetrically on either side of a center line that runs through a center point in a first direction but changes asymmetrically on either side of a center line through the same center point in a second direction which is orthogonal to the first direction.

The above system where the freeform surfaces of the reflective sections are predominately concave, as viewed from the eye, so that in the first direction, the surface elevation increases symmetrically as the distance from either side of the center line increases and in the second direction, the surface elevations increase at one rate as the distance from one side of the center line increases but increase at a different rate as the distance from the other side of the center line increases. The freeform reflective surfaces can have, in the second asymmetric direction, a difference in the average surface elevation from the base plane on either side of the center line is in the range of 0.085 to 0.150 mm. Alternatively, the freeform reflective surfaces of the reflective sections, when described using Zernike Polynomials, can have a Z5 coefficient in the range of −0.15 to −0.44 and a Z8 coefficient in the range of 0.067 to 0.202 when the Zernike normalization radius ($R_{NORM}$) is within 5% of $R_{VISOR}$.

Any of the above systems can have a horizontal distance, between the closest point of the display unit and a vertical line that extends from the front of the eye, in the range of 10-30 mm. Any of the above systems can have a vertical distance, between the closest point of the display unit and the horizontal line-of-sight of the eye, in the range of 8-20 mm.

Any of the above systems can have a tilt angle of the display unit in the range of −5 to 20 degrees. Any of the above systems where the angle between the principal light-ray from the display unit towards the visor and a line perpendicular to the display can be in the range of 10 to 40 degrees.

Any of the above systems can have a distance, between the center point of the display units to the center point of the reflective areas of the visor, in the range of 35-65 mm. Any of the above systems can have a distance, between the eye and the reflective sections of the visor, in the range of 40-90 mm.

Any of the above systems where an optical pathlength, which is the sum of the distance between the center point of the display units to the center point of the corresponding reflective area of the visor and the distance between the center points of the reflective surfaces of the visor to the eyes, is in the range of 90-130 mm. Any of the above systems where the angle that is formed between the principal light-ray along the distance from the display unit to the reflective surfaces of the visor and from the reflective surfaces to the eye is in the range of 20 to 50 degrees. Any of the above systems where the tilt angle of the visor is in the range of 10-25 degrees.

Any of the above systems wherein the fiber optic face-plate has a first straight portion with a thickness in the range of 0.7 to 1.0 mm, as measured along its vertical walls above the surface of the display, and a second portion with the curved emitting surface with a maximum thickness above the first portion in the range of 0.8 to 14 mm.

Any of the above systems where the display is an OLED display. The OLED display can comprise common light-emitting layers that emit white light across the emission area and a color filter array. The OLED display can have at least two light-emitting units that are separated by a charge-generating layer. The OLED display can have separate red, green and blue light-emitting pixels. Alternatively, any of the above systems system where the display is a LED display.

Any of the above systems where the combined reflected image has a horizontal field-of-view of greater than 40 degrees and a vertical field-of-view of greater than 25 degrees.

BRIEF DESCRIPTION OF THE DRAWINGS

FIGS. 8A and 8B is a listing of the Zernike Coefficients describing freeform surfaces 5B and 9A1/9A2.

DETAILED DESCRIPTION

Figure 1:
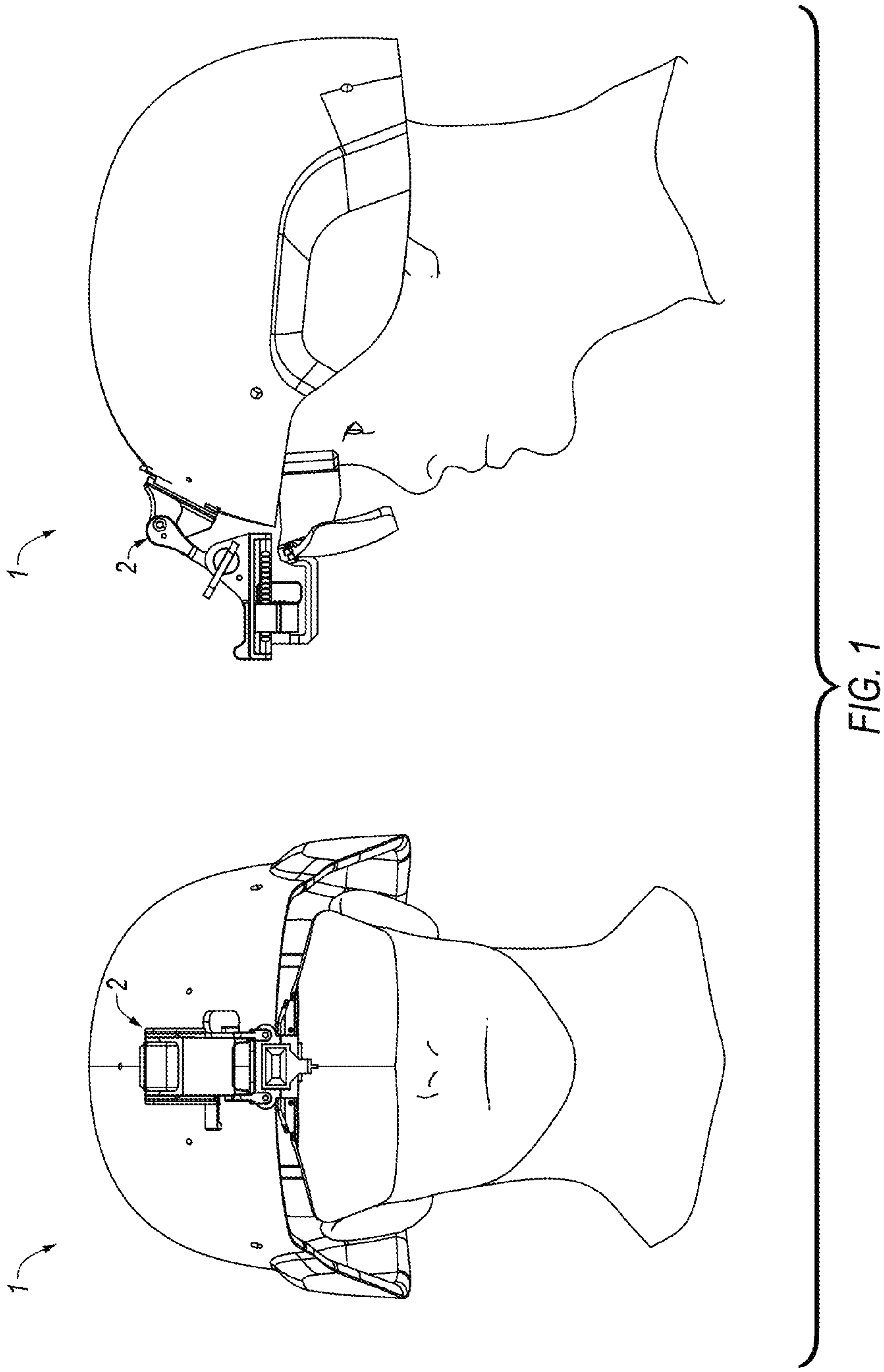
FIG. 1 illustrates front and side views of a head-mounted AR display unit 1.

In the following, a curve is a continuous, smooth flowing line that bends or changes direction at least once and is not linear. A curved shape can be two-dimensional, like circles, ellipses, parabolas, and arcs. Curved shapes can also be three-dimensional figures like spheres, cones, and cylinders. The term “Curvature” generally relates to the measure of the amount by which a curve deviates from being a straight line or by which a surface deviates from being a plane.

The slope at any point can be used to describe or characterize a curved line or surface. The slope of a curve at a specific point is determined by the slope of the tangent line to the curve at that point and corresponds to the first derivative at that point. The slope of a curved surface, particularly a freeform surface, may depend on the direction; that is, the slope at a certain point on the surface may be different depending on the direction of interest. Typically, the slope is taken in the direction of steepest ascent or descent. Another way to determine the slope of a curved surface is to take a slice along a particular direction, resulting in a two-dimensional curve which represents the curvature of the surface in that direction.

While curvature can be used as general term to describe a non-planar line or surface, curvature can also be mathematically expressed as the second derivative of the surface. For surfaces, the measured curvature can vary with direction on the surface. Curvature can be calculated in the direction of steepest ascent on the surface, and given by the by the expression $(\nabla f(x)^T \nabla^2 f(x)\ \nabla f(x))/(\nabla f(x)^T \nabla f(x))$ where f(x) is the function describing the elevation of the surface, x is the position on the reference plane, $\nabla f(x)$ is the gradient vector, $\nabla^2 f(x)$ is the Hessian matrix of second derivatives, and the superscript "T" denotes the transpose operation.

The slope of a curve at a point indicates the steepness or direction of the curve at that point, while curvature measures how much the curve deviates from being a straight line. In simpler terms, slope tells you how steep the curve is, and curvature tells you how "bendy" the curve is.

In the following, concave means "curving inward" or "hollow and curved," or, more technically, like the inside of a partial sphere when viewed from above. A crater or the inside of a bowl is roughly concave. Convex means "having a surface that is curved or rounded outward," like the outside of a contact lens. A mound or the outside of a bowl is roughly convex. It should be noted that the same surface can appear to be concave or convex depending on the point of view; that is, it will depend on the point of view of an outside observer. For example, for the aforementioned bowl, the inner surface will appear to be concave from the view of an observer, while the outer surface will always be convex. In reference to solid objects, the curvature will be described according to the view of the observer "on the air side of the surface" regardless of the orientation of the surface.

Concave or convex curves in one dimension have a slope associated with their curvature which varies as the distance from the lowest/highest point increases. Concave curves have increasing slope. Convex curves have decreasing slopes. Concavity or convexity is a measure of the curvature of a function. For a quadratic function $f(x)=ax^2+bx+c$, the concavity is determined by the coefficient 'a': if $a>0$, the function is concave up (U or concave) and the $2^{nd}$ derivative will be positive. if $a<0$, the function is concave down (n or convex) and the $2^{nd}$ derivative will be negative. If $a=0$, the function is linear (no concavity).

Some three-dimensional optical surfaces can be modeled with relatively few parameters. The simplest ones are spheres and paraboloids. More complex surface topographies are ellipsoidal and toroidal surfaces. These regular surfaces may not be complex enough to correct the aberrations in asymmetric and off-axis optical systems. In such cases, underlying simpler shapes (e.g. spherical) may be modified with smaller features to become freeform surfaces. A freeform surface has no translational or rotational symmetry about axes normal to the mean plane and does not conform to any regular shape. While they do not have discontinuities or abrupt dislocations, freeform surfaces may have curvatures that vary in different locations and/or in different directions from a given point.

When considering three-dimensional freeform surfaces, the surfaces can be described by the elevation at positions on a two-dimensional base plane normal to the optical axis of the design in two ways. First, the point-by-point elevation of the surface above a flat reference plane can be used to generate 2D or 3D contour maps. Second, the point-by-point deviations (difference) of the surface from a best-fitted regular curved shape (i.e., usually a sphere, but in some cases, a cylinder or a toroidal shape) can also be used to generate contour maps. In terms of designing the freeform surfaces of optical components, it is often useful to find the deviations of a freeform surface after subtracting the "best-fit spherical shape" determined over the active (patterned) area of the surface.

A best-fit sphere (BFS) is a mathematical model used to find the sphere that best approximates a set of three-dimensional data points, minimizing the distance between the points and the surface of the sphere. This is often done using least squares fitting techniques. The best-fit sphere is constrained to have the same elevation as the surface at the center and can be characterized by its radius of curvature. Point-by-point subtraction of the best-fit sphere from the corresponding optical freeform surface results in another two-dimensional surface corresponding to the deviations from the best-fit sphere at each point. By this procedure, if at any location the curvature of the deviation surface is positive then this reflects increased curvature or enhanced curvature relative to the best-fit sphere, and if the curvature is negative then this reflects decreased curvature or suppressed curvature relative to the best fit sphere. Plotting the derivation at each point results in a contour map of the deviations (from the best-fit sphere) that forms a deviation surface that is different from but still reflects the shape of the optical surface. This scaling by removing the underlying sphere allows the resulting characterization to be independent of the base-sphere size, and the characterization will apply for a wide range of underlying sphere sizes. The underlying symmetry of these deviation surfaces is well suited for analysis using the set of Zernike polynomials which are orthogonal when integrated over the unit disk. The orthogonality property results in computationally efficient methods for determining the best-fit parameters.

It should be understood that the curved surface of an optical component will often be designed based on a known regular shape. Freeform surfaces will have deviations (no matter how small) from a regular shape. In the design of the optical components of AR system 1 (see FIG. 1), such as the display unit and visor, the starting point may be a known regular shape, such as a base-sphere with a predetermined base-sphere radius and modifications made as necessary to create a freeform surface. In an ideal world, the best-fit sphere would be exactly the same as the base-sphere in terms of radius. However, the surfaces of the optical components, which may have been modified from a regular shape and the areas of interest (i.e., the emitting surfaces 5B in the display units 8 or the reflective surfaces 9A1/9A2 in the visor) may represent only a portion of the overall shape. Thus, a best-fit sphere, as calculated from a finite portion of the sphere, may not have exactly the same radius as the base sphere, although it is likely to be close. In addition, the use of a best-fit sphere to generally describe a freeform surface includes the contribution of any small-scale modifications made to the surface. Moreover, the use of the best-fit sphere, which is usually calculated from a portion of the surface, allows for analysis of the surface when the base sphere, which is part of the original design, is not known.

Freeform optical surfaces can be entirely (100%) concave or convex in shape or may be a mixture of the two depending on location on the surface. It is important to note that even when the freeform optical surface is entirely concave or convex at every point, the amount or degree of concavity or convexity may vary from one location to another. However, these localized variations in the curvature or slope in the freeform optical surfaces may be much smaller than the overall curvature and will not change the overall shape. These localized micro-changes in curvature can be determined using a contour map of the point-by-point differences where either the base plane or the corresponding best-fit sphere has been subtracted from the optical surface. For either a concave or convex optical surface, a point on the corresponding difference surface (as described above) is deemed to have increased curvature if the second derivative at that point on the contour map of the differences (as measured in the direction of steepest change) is positive and suppressed curvature if the second derivative is negative. In some cases, the magnitude of the changes may be large enough so that the optical surface becomes flat or even has the opposite curvature (i.e. convex in an otherwise concave shape) at that particular location.

Figure 5B:
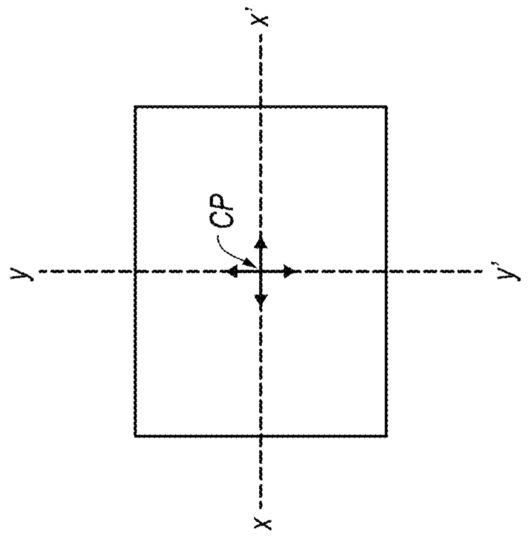
FIGS. 5A and 5B illustrate the center point and orthogonal lines x-x' and γ-y' for different shapes.
Figure 5A:
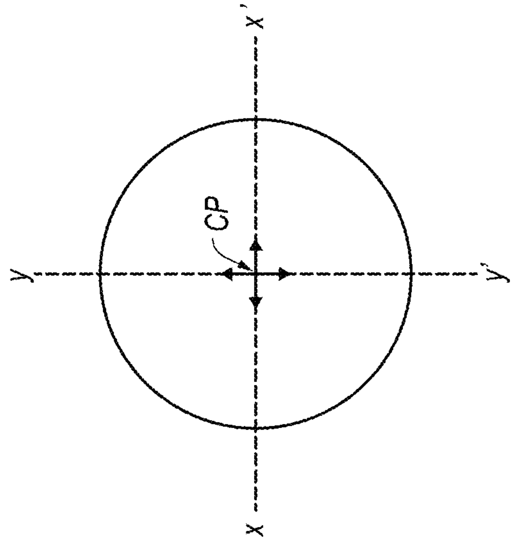

Any regular or approximately regular shape will have a center point through which imaginary orthogonal lines can be drawn. This is illustrated in FIGS. 5A (circle) and 5B (rectangle). Both shapes have a center point (CP) through which lines x-x' and y-y' are drawn. These lines are orthogonal (perpendicular) to each other. Thus, changes can occur in a direction parallel to the x-x' line (designated as the first or x-direction) or in an orthogonal direction parallel to the y-y' line (designated as the second or y-direction). Note that these directions will be independent of rotation around the center point (i.e. not limited to the vertical and horizontal directions as shown in FIGS. 5A and 5B) and remain orthogonal to each other in any position. Since the optical surfaces may be symmetric or asymmetric depending on the direction, there will be an Axis of Symmetry (AofS) as well as an Axis of Asymmetry (AofA). In the Figures, the AofS of the freeform surfaces will be shown as corresponding to the direction of the vertical y-y' line. This means that in the figures, the areas on either side of the vertical AofS are symmetrical and will be the same (i.e. the left and right sides will be identical in terms of surface elevation, slope or curvature). Likewise, the AofA of the freeform surfaces will be shown as corresponding to the direction of the horizontal x-x' line. This means that in the figures, the areas on either side of the horizontal AofA are asymmetrical and will be different (i.e. the top and bottom sides will be different in terms of surface elevation, slope or curvature). Although the AofS and AofA are shown as corresponding to the vertical and horizonal direction, this is only by convention and they may be rotated from these directions, so long as they remain orthogonal.

Since the desired system is head-mounted, it is very desirable that the AR system be light, robust and as close to the head as possible. For military applications, it would be part (either integral or removable) of a helmet or protective gear that covers most of the head. In the case of fighter plane pilots, the visor for the AR system is integrated inside the face shield of the helmet. In the case of soldiers, the soldiers wear protective eyewear for protection from particles in the air, shrapnel, and bright light. However, in the US IVAS system (Integrated Visual Augmentation System), the visor is integrated into a system that is attached to the helmet.

Ideally, most, if not all, of the AR system would fit within the helmet, which would provide protection to the components of the AR system as well as the user's face. However, this is an extremely congestive space and so both the physical size and the spacing of the AR system components will be critical. Moreover, the AR system must deliver to the eye, with minimal optical distortion or aberration, a computer-generated image of a minimum aim size, at an aim resolution and that is bright enough to be seen under most conditions (including bright daylight).

The size of the eye-box is an important factor in determining the optics of an AR system. The eye-box is the volume of space within which an effectively viewable image is formed by the visual display, representing a combination of exit pupil size and eye relief distance. The eye-box is often equivalent to the overall area where the eye could reside. The exit pupil (a virtual aperture in the optical system) can be smaller than the eye-box and can move around and consists of the range of eye positions. This includes both angular and lateral movement of the eye. A larger eye-box increases the area in which the full field-of-view can be viewed, but results in more aberrations. A smaller eye-box has a two-pronged effect; there are fewer aberrations due to the smaller pupil and the reflective surfaces on the visor do not need to be as tilted to clear the display out of the way. A suitable eye-box size is considered to be between 4-10 mm, and is typically 6-8 mm. It should be noted that, in general, a larger eye-box can be desirable as activities will shift the alignment of the helmet to the head. However, a smaller eye-box would be acceptable in some embodiments (for example, a person using the AR system in a controlled environment such as maintenance, repair, medical, or training).

The size of the viewed computer-generated image is best described in terms of field-of-view (FOV). The field of view is the angular extent of the observable world that is seen at any given moment. FOV is typically expressed in terms of number of degrees along the direct line of sight. For a binocular AR system, a desirable FOV in the horizontal direction (HFOV) would be at least 40 degrees and more desirably, at least 45 degrees but 60 degrees or less. Assuming that the computer-generated image is centered, this allows for unobstructed vision to the sides. In some embodiments, it could be advantaged to have a larger HFOV on the side away from the nose, giving more peripheral awareness on the outside so that the nose-side of the optical element is truncated. A desirable FOV in the vertical direction (VFOV) would be at least 25 degrees, and more desirably at least 30 degrees but 45 degrees or less. This would allow for unobstructive vision below and above the direct horizontal line of sight. In some embodiments, the HFOV and VFOV can be greater than these desirable values, but will reduce the amount of unobstructed vision. The unobstructed view above the reflected image is particularly important and it would be desirable to maintain at least 20 degrees of "sky-view" above horizontal as measured from the center of the pupil.

It is important to note that for a fixed microdisplay size, increasing the aim HFOV or VFOV requires decreasing the focal length of the visor, making it more curved which increases optical aberrations and distortions. Furthermore, increasing the aim VFOV requires the visor to be tilted up more so the display doesn't block the light rays from the visor to the eye, resulting in more aberrations. There is also a dependence between FOV and display size. For the same FOV, a smaller display requires a shorter focal length of the visor, making it more curved which increases optical aberrations and distortions.

There are many ways to determine the resolution of a computer-generated image as seen by the eye. The resolution of a human eye usually means visual acuity, which is a measure of how well small details are resolved in the very center of the visual field. Visual acuity is often measured according to the size of letters viewed on a Snellen chart. For example, using the Snellen chart, 20/40 vision means that a person can resolve symbols at 20 feet that a person with normal vision can resolve at 40 feet. Alternatively, visual acuity can also be measured using an E chart, which is also known as a tumbling E chart. In this kind of chart, the appearance of both the size and direction (i.e. up, down, left, right) of the "arms" of a letter E symbol are important. This kind of chart is particularly useful for an VR application where spatial resolution in both horizontal and vertical directions is important.

For displays, visual acuity is often quantified in terms of cycles/degree, which is a measurement that is generally independent of viewing distance. For example, 20/20 vision would typically correspond to 30 cycles/degree. One aim for AR system 1 is to have visual acuity roughly equivalent to 20/40 vision. However, since the visual acuity as measured by cycles/deg can be dependent on the contrast of the target (for example, a B+W pattern of lines with decreasing sinusoidal line and space widths), visual acuity can be more accurately expressed in terms of MTF (modulation transfer function) which takes into account both factors. In devices such as AR system 1 where the optical design is constructed from the long conjugate (eye-box) to the short conjugate (display), it is common to express visual acuity in terms of cycles/mm at the display instead of cycles/deg. For AR system 1, the equivalent of 20/40 vision would correspond to a value of no less than 20% modulation at 16 cycles/mm, the Nyquist cut off frequency.

Moreover, it should be noted that visual acuity will also depend on the pupil size. Thus, a visual acuity (geometric mean of sagittal and tangential components of the MTF) at a cutoff frequency of 16 cycles/mm when the display has at least 30 pixels per degree should be greater than 20% everywhere within a circular pupil with a 4 mm diameter, and more preferably with a 7 mm eye-box.

There is a relationship between visual acuity/resolution and the pixel size of the display. In particular, in order for the eye to resolve a feature in a pixelated image, the individual pixel size of that image cannot be larger than that feature. For example, in a tumbling E-chart, in order to fully resolve an 'arm' in an E symbol visually, the size of the pixel in the image must be at most the same as the width of the 'arm'. The pixel size can be smaller so that the image of the 'arm' will be composed of more than one pixel. However, if the pixel is larger than the width of the 'arm', the 'arm' may not be properly discernable since the feature is smaller than the pixel. In that case, the visual resolution of the image as seen by the eye would be insufficient.

FIG. 1 shows a front and side view of one embodiment for a binocular AR head-mounted display (HUD or head-up display) system 1. In this embodiment, the system 1 is mounted using a bracket 2 on a helmet that covers the top of the user's head.

Figure 2:
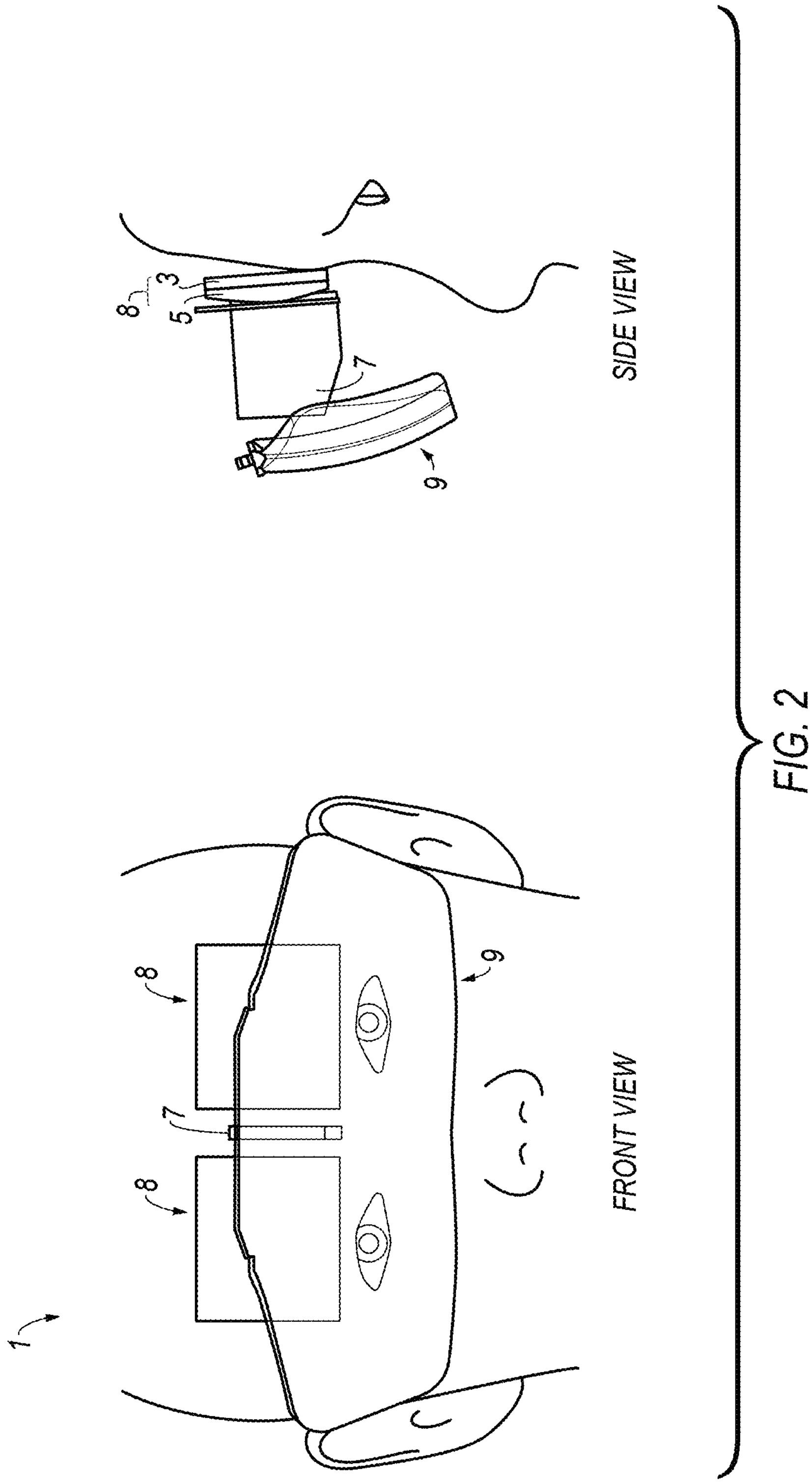
FIG. 2 are close-up front and side views of AR system 1.

FIG. 2 shows closer front and side views of 1 and identifies some of the individual components present (bracket 2 not shown). There are two identical pixelated displays 3 whose emissive surfaces each are in direct optical contact with the face of a separate fiber optic faceplate 5. There is a support bracket 7, located between the displays 3 and outside the emission light pathway, which provides support for the curved semi-transparent visor 9 and in some embodiments, where the display PCBs (printed circuit boards) or other display controls are located. The visor 9 can be permanently attached to the support bracket 7, or be detachable from the support bracket 7 so it can be removed entirely and then replaced, or hinged so that it can be easily moved out of the line of sight. The visor 9 is semi-transparent so that external light can pass through to the eye and has a partially reflective inner surface which reflects the image from the optical fiber faceplate to the eye.

Figure 3A:
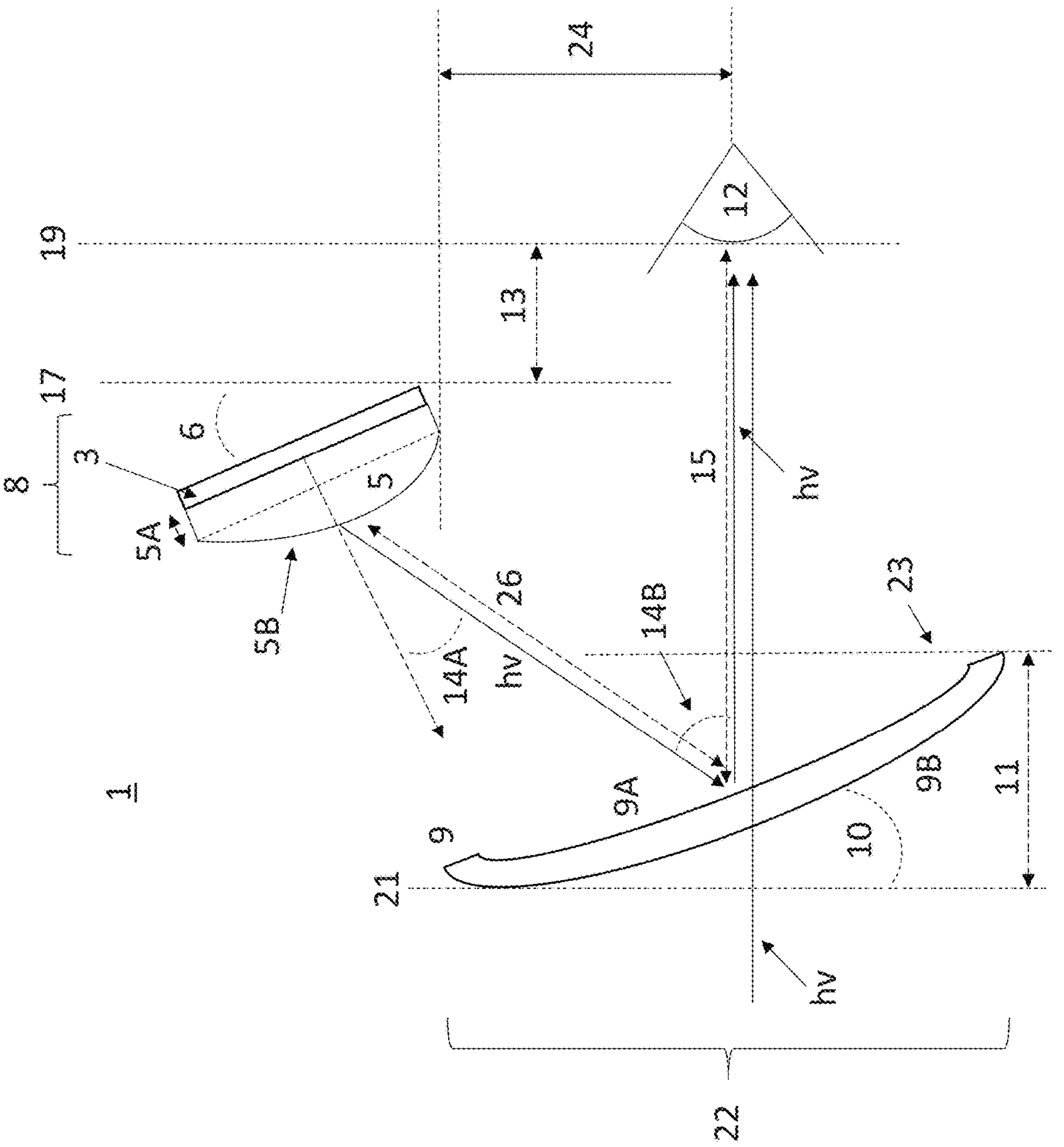
FIG. 3A is a schematic side view of the optical path for AR system 1.

As can be seen in FIG. 2, the space in which the AR system 1 is located is restricted and the entire system is physically limited in terms of size. FIGS. 3A (side view), 3B-3C (top views) and 3D (view from the eye) are schematic diagrams of AR system 1 identifying some of the important distances, angles and other characteristics for AR system 1 as well as showing the optical light path.

FIGS. 3A-3D illustrate the schematic optical layouts and components for an AR system 1. For simplicity, only one display unit and one eye pupil are illustrated in FIG. 3A although AR system 1 is binocular. Accordingly, there are two displays (left and right) present that are identical in terms of positioning relative to a left and right eye. In FIG. 3A, the identified angles are for the principal center light rays.

In FIG. 3A, there a display 3 which has an emissive front surface. Display 3 is tilted at an angle 6 (relative to an imaginary vertical line 17 which is parallel to another imaginary vertical line 19 from the pupil of the eye 12) and whose closest point is set at a horizontal distance 13 away from imaginary vertical line 19. Over the emissive surface of each display 3, there is a fiber optic faceplate or billet 5. Each of the fiber optic faceplates has two sections: a straight portion 5A which extends perpendicular to the emissive surface of 3, and a second portion that has a curved front surface 5B from which the light originating from display 3 is emitted. Generally speaking, surface 5B will be convex; that is, the corresponding best-fit sphere will appear to be mound-shaped as viewed from the visor. The curved surface 5B can have an average radius of curvature (ROC) even if it has a non-spherical shape since any variations will be relatively small. The display 3 and the optical fiber faceplate 5 form a single display unit 8. The closest point of the display unit 8 (bottom edge) is also set at a distance 24 above a line that extends along the horizontal line-of-sight of the eye pupil.

The light emitted from each of fiber optic faceplate surfaces 5B is then reflected off the interior surface 9A of curved semi-transparent visor 9, which is arranged to reflect the emitted image from each display unit 8, towards the pupil of the eye. The interior surface 9A has two optically modified reflective sections or regions (9A1 and 9A2 in FIGS. 3B-3D) where each region has a reflective freeform surface where the light from each of display units 8 (emitted from surface 5B) is reflected towards the appropriate (left or right) pupil of the eye 12. Regions 9A1 and 9A2 are identical; in particular, the reflective surfaces (also referred to as 9A1 and 9A2) are the same in each region. The distance between the center point of the display unit 8 and the center point of the reflective surface 9A1/9A2 is 26, which also represents the optical path of the principal light-ray. Off-axis angle 14A is formed between the principle light ray from the display unit 8 being emitted towards the visor and an imaginary line that is perpendicular to the display (shown as a dotted arrow). Generally speaking, each of the surfaces in reflective areas 9A1 and 9A2 are curved and will appear to be concave with respect to radius; that is, each will have the same best-fit sphere as viewed from the eye and will appear as looking down into a bowl-shaped cavity. The interior reflective surfaces of 9A1 and 9A2 of the visor 9 are set at a distance 15 from the pupil of the eye 12 along the direct line-of-sight, which also represents the optical path of the principal light-ray towards the eye. Angle 14B is formed between the optical pathway of the principal ray 26 from the display and the direct line-of-sight 15. Angle 14B corresponds to twice the visor tilt angle 10. The visor 9 is also tilted at an angle 10 relative to imaginary vertical line 21 (which is also parallel to lines 17 and 19). The curved and tilted visor 9 also has an apparent side depth 11 which is the distance between imaginary parallel lines 21 and 23. Visor 9 also has an exterior surface 9B through which light from the external world passes to the eye pupil 12. The visor 9 also has a height 22 and a vertical curvature that can be different from the curvature in 9A1 and 9A2.

Figure 3B:
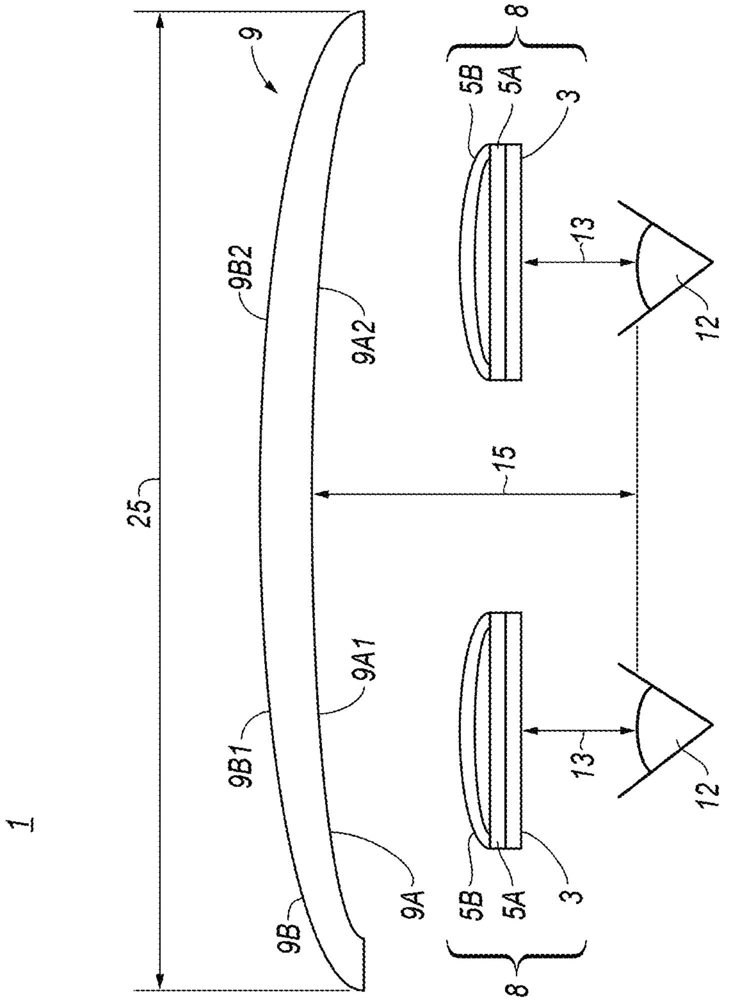
FIG. 3B is a schematic top side view.

FIG. 3B is a schematic top-view of the AR system 1. It should be noted that the level of the eyes 12 is below the display units 8 by the distance 24 and the visor 9 is at least partially at an intermediate level between the level of the eye pupils 12 and the display units 8 which are uppermost. The visor 9 has a width 25 and a horizontal curvature that can be different from the curvature in 9A1 and 9A2. On the interior surface 9A of the visor 9 are two reflective sections 9A1 and 9A2 which reflect the light emitted by the display units towards the eye pupils. As shown in FIG. 3A, the visor 9 is located a distance 15 from the eye pupils 12. Although reflective sections 9A1 and 9A2 have freeform surfaces that are different from the surfaces of the non-reflective sections of the inner visor surface 9A, the variations in the surfaces are comparatively small. In this visor design, the overall curvature of reflective sections 9A1 and 9A2 is similar to the overall horizontal curvature of the visor 9.

Figure 3C:
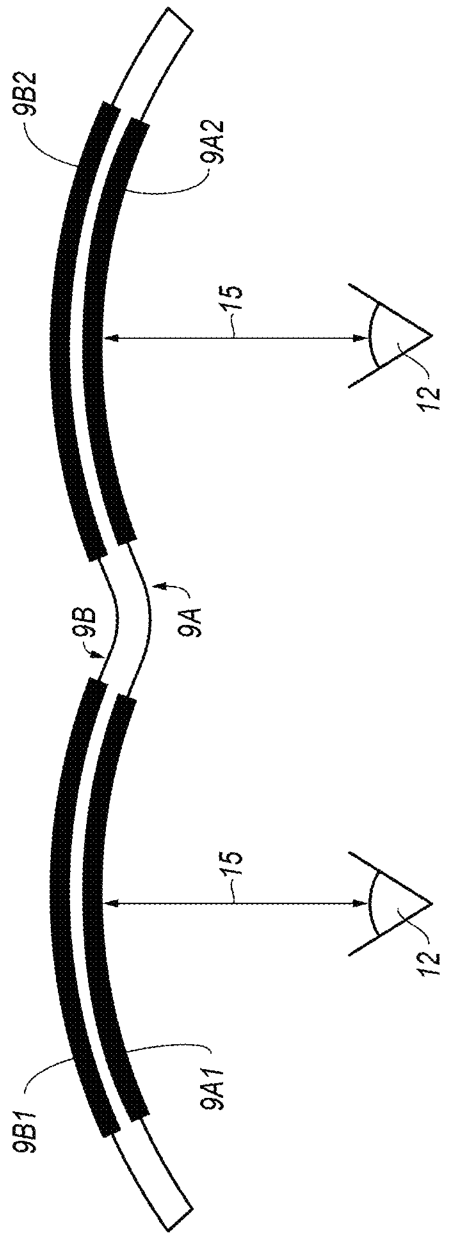
FIG. 3C is a schematic top side view of a different embodiment for the visor 9.

FIG. 3C is a schematic top-view of another embodiment for the visor 9 as shown in FIG. 3B (display units not shown). In FIG. 3C, the visor 9 has two centers for radii of curvature for regions 9A1 and 9A2 (shown as thicker lines) which are aligned to the center of each eye. There is no single common curvature for the visor 9. Also illustrated (as thicker lines) are sections 9B1 and 9B2 on the outer surface 9B of the visor 9; each opposite the corresponding freeform reflective surfaces of 9A1 and 9A2 on the inner surface 9A of the visor 9.

It is possible to enlarge 9A1 and 9A2 in the horizontal direction which will allow for adjustments in the HFOV. For larger sized reflective surfaces or displays, it may be that each monocular section is rotated about a roughly vertical axis to form a binocular arrangement so that collisions of the images delivered to each eye are avoided. The visor and/or display can be larger in cases where the geometry is changed (more airspaces) or if the FOV is extended. Desirably, the rotation (as measured from a vertical line) is less than 5 degrees, preferably, 3 degrees or less.

Figure 3D:
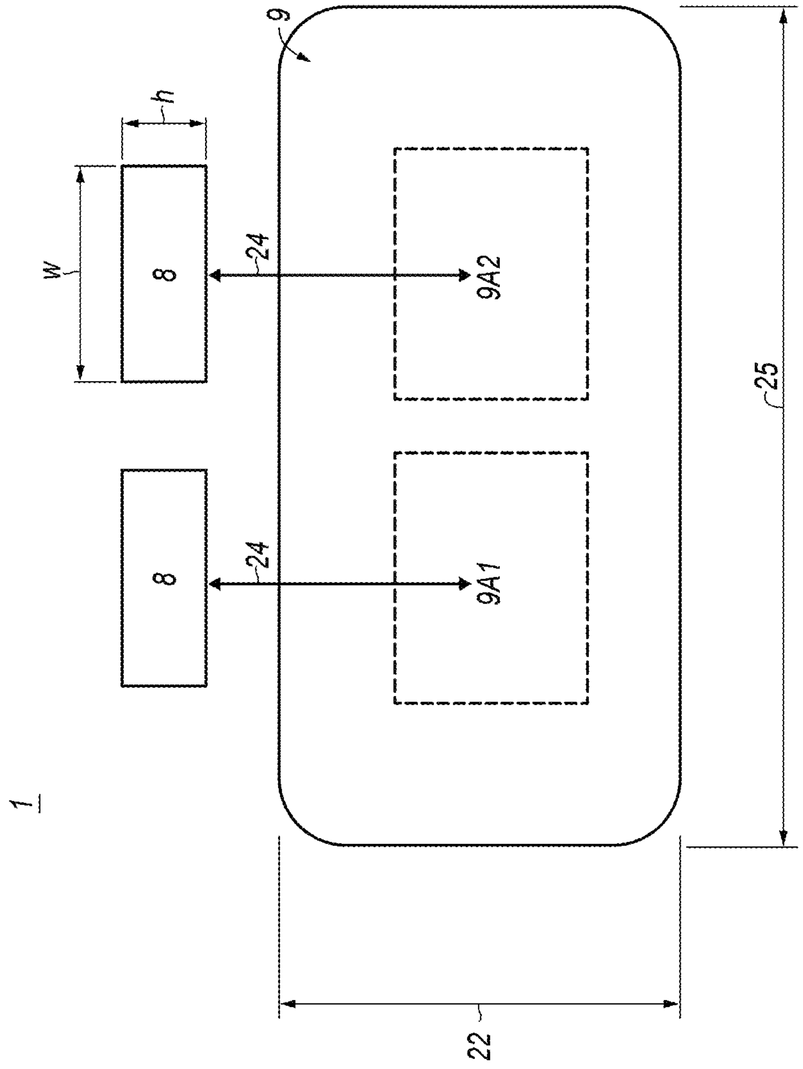
FIG. 3D is an inside (from the eye) view.

FIG. 3D is a schematic view of the AR system 1 (not in operational mode) from the eyes looking out through the visor 9 at the external world. Display units 8 are located above the eyes by a distance 24 and are not in the direct line of sight. Each of the display units 8 have the same width (w) and height (h); in this embodiment, the fiber optic faceplate 5 has the same width and height as the display 3. Light from the display units 8 (which are tilted) is reflected off reflective sections 9A1 and 9A2 on the visor 9 to the pupils of the eyes. In this example, the reflective sections 9A1 and 9A2 are each centered directly in front of the eyes along a horizontal line-of-sight. The visor 9, which is curved, has a wrap-around width 25.

Figure 4A:
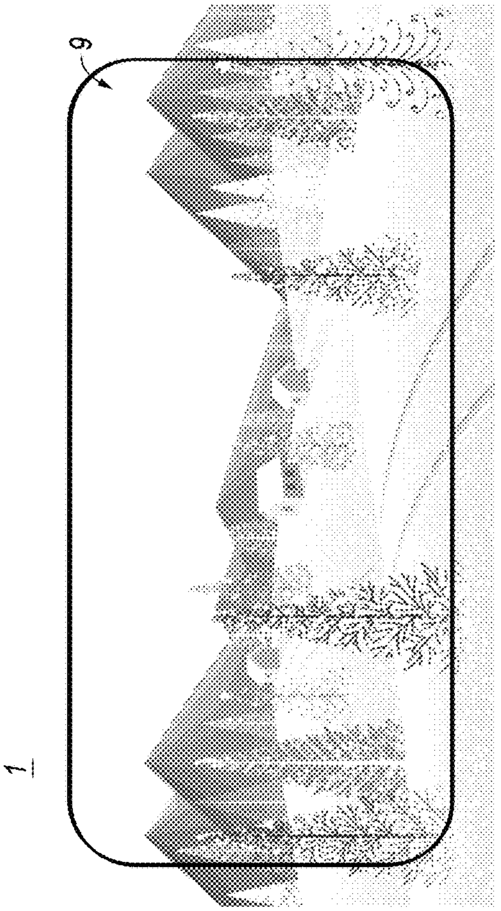
FIG. 4A is an external view seen by the wearer of AR system 1 when the display units are not operational.

FIG. 4A illustrates an example of the external view seen by the wearer of AR system 1 as shown in FIGS. 3A-3D when the display units are not operational. Since the visor 9 is at least partially transparent, an external scene can be seen through that visor. Note that in this illustration, the edges of the reflective sections will not be readily seen.

Figure 4B:
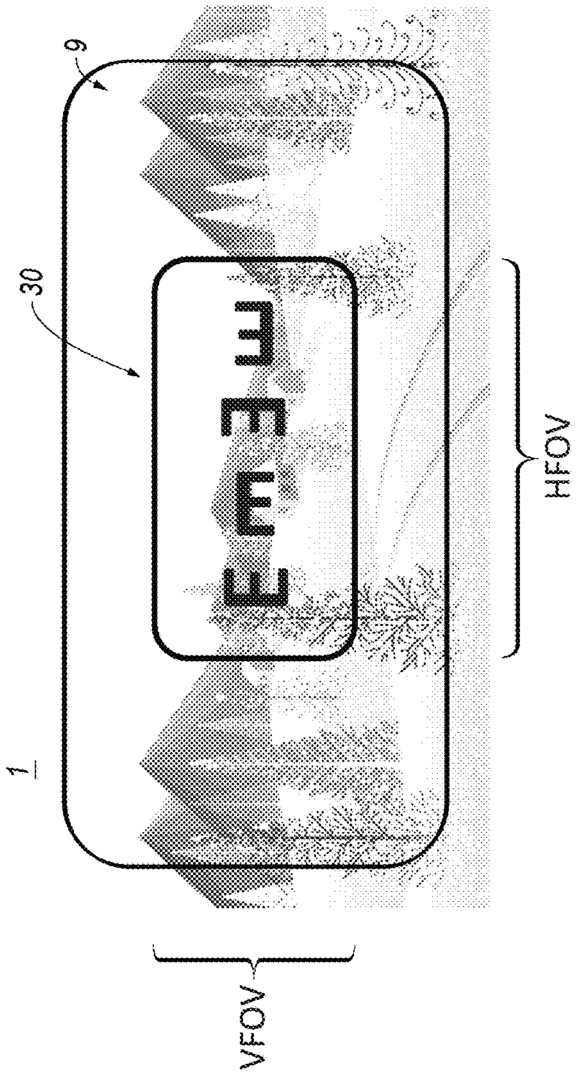
FIG. 4B illustrate when the display units are operational and a reflected image is superimposed over the external view.

FIG. 4B shows an example of the same view of AR system 1 when the display units are emitting an image. In FIG. 4B, the display units 8 emit an image 30 (in this example, tumbling Es within a visible border) which overlays the external scene. Note that because the system is binocular and the display units 8 and reflective sections 9A1 and 9A2 are cooperatively designed, the reflected images are combined into a single viewed image 30 and not two separate images. Note that the external scene remains partially visible in sections 9A1 and 9A2. FIG. 4B also indicates the VFOV and HFOV for the combined image generated by the display units 8 together with reflective sections 9A1 and 9A2. Note that the border surrounding the combined reflective image is optional and may not be present. Moreover, the generated image may be such that at times, it fills the entire FOV and is sufficiently bright that the external view is substantially blocked.

The optical path in AR system 1 is simple, direct and compact. It only has the visor 9 between the light source (display unit 8) and the pupils of the eyes. Other than the fiber optic faceplate 5 (part of the display unit 8) and the reflective regions 9A1 and 9A2, there are no other optical components involved. There are no separate lenses or waveguides present and there is only one reflection involved. Not only does this avoid additional weight, but also makes the system robust and simple to manufacture and maintain. It should be noted that the optical path in AR system 1 requires a number of compromises. For example, moving the eye closer to the visor (i.e., decreasing 15) will make it necessary to tilt the visor upwards to keep that distance satisfied. This will degrade the image rapidly.

Moreover, tilt and curvature of the display unit 8 and visor 9 can cause "barrel" and "keystone" distortion in the reflected image. Barrel distortion is a type of optical distortion where straight lines near the edges of an image appear to curve outward, resembling the shape of a barrel. Keystone distortion is a type of optical distortion where the resulting image resembles the keystone of an arch. These kinds of distortions can be corrected using image editing software or by adjusting the display. In order to compensate for barrel or keystone distortion, it is desirable for the imaging software to calculate a modified rectangular shape for the image. In this way, no further adjustments in the optical pathway are necessary.

While any kind of display can be used as the display 3, OLED displays are preferred. They are light-weight (desirable for any HUD display), can provide high luminance (desirable for daylight use) and have low power consumption (desirable for battery life or size). They are self-emissive, have excellent image quality, are very efficient compared to LCD or LCoS, and have an ultra-high color rendition and wide color space. Self-emissive OLED devices have the important advantage over backlight devices (such as LCD) in that each pixel only produces the intensity required by the image, whereas backlighted pixels produce maximum intensity followed by absorption of the unwanted light. On the other hand, OLEDs can have limited luminance and lifetime. Moreover, formation of an OLED over the transistor backplane is much easier and lower cost than formation of a microLED display because OLED layers can be vacuum deposited or directly coated on the transistor backplane. AR systems can use a full-color display or could be monochrome for some applications. Suitable designs and formulations for both full-color (i.e., RGB and RGBW) and monochrome (i.e., green) emitting OLEDs are well-known and any suitable design may be useful. From a manufacturability and cost perspective, it would be preferable to use multi-stack white-light emitting OLEDs where the individual color formation requires color filters. In particular, such OLEDs have common light-emitting layers that extend across the entire emission area and in aggregate, will emit white light. Individual colored pixels are then formed by using color filter arrays (CFA). Alternatively, the OLED display can have separately colored pixels and there is no need for a CFA. In order to achieve high luminance, it is common to use multiple light-emitting units stacked together where each light-emitting unit is separated by a charge-generation layer (CGL). A light-emitting unit comprises at least one light-emitting layer and at least one, preferably two, non-light-emitting charge-carrying layers such as a hole-transport layer and/or an electron transport layer.

Two separate displays are necessary to provide binocular vision. Preferably, the displays are identical in all respects. In order to meet the necessary requirements of light-weight and to fit within the space requirements, the area of both of the displays must be relatively compact in size. Displays, including OLED displays, are typically square or rectangular in shape and have a planar emitting surface for manufacturing reasons. However, other shapes such as circular or oval of equivalent area are known and can be used if necessary.

The size of the displays is related to the total amount of light output; when all other factors are the same, a bigger display will emit more light than a smaller one. However, in a highly congested and physically constrained system, the amount of space for the displays is very limited. The displays for AR system 1 should be sized so they can deliver at least 6800 nits of light output, desirably at least 10,000 nits. In order to meet the requirements of AR system 1, it is preferred that the display be rectangular. It is preferred that the width of the emitting area of the display be in the range of 30 to 45 mm, preferably 35 to 42 mm and the height of the emitting area be in the range of 25 to less than 40 mm, preferably 30 to 35 mm. Thus, the diagonal of the rectangle should be between about 40 and 60 mm. Displays larger in size, such as cellphones which typically have a diagonal of at least 7.5 cm in and more typically 13-17 cm, are not suitable for this application. Smaller displays, even though they may have high luminance, also are not suitable for this application. Without magnification (which would add weight and complexity) and because of the relatively short distances involved, they may not be able to provide a large enough FOV. Displays in this preferred size range can be considered to be among the largest microdisplays but smaller than a cell phone display.

Although the emitting area of the displays are individually limited to a certain size range, high resolution of the reflected image is still required. Normally, smaller pixel sizes and the higher pixel count in terms of metrics like pixel pitch leads to higher resolution. Pixel pitch refers to the distance between the centers of two adjacent pixels. A larger pixel pitch correlates with a larger pixel area.

For example, Table 1 lists the following parameters for various commercially available categories of displays:

TABLE 1

Pixel Pitch and Areas (in μm and μm$^2$)

| Category | Display Type/Source | Pixel Pitch | Pixel Area |
|---|---|---|---|
| Microdisplay | LCOS (FSC) | 4.3 | 18 |
| | DLP (FSC) | 5.4 | 29 |
| | OLED | 9.3 | 86 |
| | Epson HTPS | 9.6 | 92 |
| Mirco LED | Apple/Lux Vue, Limiode, Oculus/InfiniLED, others | 25 | 625 |
| Cell Phone | Sony Z5 P 4K LCD | 31.5 | 993 |
| | Samsung S8 OLED | 44.6 | 1986 |
| | Oculus CV1 OLED | 55.7 | 3103 |
| | iPhone 7+ LCD | 63.3 | 4012 |
| 4K Monitor | 24" LCD | 137.3 | 18851 |
| Television | 40" 4K OLED/LCD230.5 | 230.5 | 18851 |
| | 55" 4K OLED/LCD | 316.9 | 100433 |

One example of a commercially available VR product is Apple Vision Pro, which uses micro-OLED displays (3660×3200 pixels) that have a pixel pitch of 7.5 μm. Sony sells an OLED microdisplay (ECX350F) for AR applications with a diagonal display size of 11.235 mm with a pixel pitch of 5.1 μm which is used in a number of AR systems by different manufacturers.

Sony PS2 VR2 Headset uses an OLED display, which is approx. 60 mm×60 mm in size, with 2,000×2040 resolution for a pixel pitch of ~30 μm. However, since this is a VR system which is self-contained and there is no external light present, high luminance is not required.

As shown above, current AR systems use microdisplays which have very small pixel sizes which are closely spaced (pixel pitch <10 μm). Given the need for a display size in AR system 1 that is larger than most microdisplays but much smaller than most cellphone displays, it has been found that it is not necessary to have such small pixel sizes or low pixel pitch to achieve the desired resolution. As mentioned previously, visual resolution is related to pixel size; the minimum size of the pixel corresponds to the size of the image that needs to be resolved. Having more and smaller pixels may enable increased resolution by being able to define smaller features; however, such increases in resolution may not be needed. Being able to have larger pixel size and pixel pitch while still achieving the desired resolution is very desirable since the larger pixel size can provide more luminance. This is because there are non-emitting structures between pixels whose size is independent of pixel area. As the pixel area gets bigger, these structures occupy a smaller fraction of the emitting area. This will increase the overall luminance of the display and so, improves the overall brightness of the reflected image. In particular, the pixel pitch of the display 3 in AR system 1 should be in the range of 10-60 μm, more desirably in the range of 15-50 μm and most desirably, in the range of 25-40 μm. This will allow for resolution of image features of similar size; for example, a pixel pitch of 30 μm should allow for the recognition of letters made with bars that are 30 μm wide. This corresponds to a Nyquist cut-off frequency of 16 cycles/mm. Alternatively, the pixel size in the OLED microdisplay can be no larger in the horizontal and vertical directions, when viewed through the system, than 1/15 of a degree (4 arc minutes) in that direction, and more preferably less than 1/30th of a degree (2 arc minutes).

A common resolution used by low-power cameras and sensors (e.g. night vision, thermal imaging) is SXGA which has $1280 \times 10^{24}$ pixels. Such external devices would typically be used to generate the images to be displayed in AR systems. In AR system 1, pixel pitches in the described range are a compromise between viewing finer detail versus seeing a wider FOV. For example, using 40×35 mm displays with a pixel pitch of about 30 μm in a head-set designed to give good visibility at a resolution of 30 pixels per degree, the SXGA image in 1 would result a HFOV of about 43 degrees and a VFOV of about 34 degrees.

Most displays, and in particular OLED displays, with a planar surface emit light that is diffuse and not collimated;

that is, the light rays are not parallel. However, for a clearer view of the image into the eye, it is important that the image be moved from the flat OLED displays surface 6 to the curved surface 5B, as shown in the optical design. This is achieved by using a fiber optic faceplate (billet) 5 that is in optical contact with the planar emissive surface of the display 3. Together, the fiber optic faceplate 5 and the display 3 form a display unit 8. Ideally, the base of fiber optic faceplate 5 is planar and in direct physical contact with the emissive planar surface of the display 3. An optical fiber is a glass or plastic fiber that can transmit light from one end to the other acting as a waveguide. Such optical fibers can be bundled together in a parallel fashion as to create a fiber optic billet. The purpose of the fiber optic faceplate is to capture the image emitted by the display and transport the image through the individual optical fibers to the emitting surface 5B of the faceplate. The fiber optic faceplate 5 can be made of glass or plastic. Even though the individual optical fibers may be smaller or larger than the pixels of the displays, there is no need to locate them precisely relative to the pixels. A single fiber can transport the light from more than one pixel or the light from a single pixel can have its light transported via one or more fibers. The fiber optic faceplate may match the size or shape of the display or be different. It is preferred that the base of the fiber optic faceplate 5 matches the size and the shape of the display 3, which is desirably rectangular. The use of a fiber optic faceplate 5 is desirable, in addition to being lightweight, because it is non-bulky so that the display unit 8 can remain relatively thin. This eliminates the need for additional lenses or other optical components that must be spaced apart from the display 3. The fiber optic faceplate should not be considered to be a "lens" or other imaging optic. Because the fiber optic faceplate doesn't focus the image from the display to a plane, eliminating this constraint allows the optical system to be greatly simplified without sacrificing performance.

The fiber optic faceplate 5, which is one single integral piece, has two differently shaped portions or sections: a first straight section 5A that is closer to the emitting surface of the display and that extends some distance above the base/display interface with linear vertical walls; and a second end section, further away from the display, which has a curved emitting surface 5B. Section 5A collects the dispersed light from the emitting surface of the display 3. Section 5A also helps the faceplate to be more physically robust during the manufacture of emitting surface 5B. The total thickness of the fiber optic faceplate 5 should be in the range of 1.5-15 mm. More desirably, the total thickness of 5 should be in the range of 4 to 13 mm. In particular, the thickness of first portion 5A (as measured along the vertical side walls) is in the range of 0.7-1 mm and the thickness of the second portion with emitting surface 5B should be in the range of 0.8 to 14 mm (at its maximum thickness above section 5A).

Light from the surface of display 3 is transported through section 5A and then emitted from the surface 5B of the fiber optic faceplate 5. The exact shape of the surface of 5B does not appear to be critical in terms of the reflected image resolution. Any differences in performance are of a small enough magnitude that can they can be corrected by other system components such as 9A1 and 9A2. The outer surface 5B should be curved (i.e. spherical, ellipsoidal, cylindrical, toroidal, aspherical or freeform) as necessary. However, a freeform curved surface for 5B is preferred since it allows the system to have increased visual acuity.

The preferred freeform surface 5B can be described in terms of surface elevation below a base plane or deviation from a best-fit base sphere surface. The procedure used for determining the best-fit sphere using the RoC for the base surface and the Zernike coefficients is to calculate the elevation of the surface over N×M (x,y) points using 401 x 401 (x,y) points that are linearly distributed across the full rectangular aperture in x and y, including at the edge of the aperture. The freeform surfaces are constrained during design so that their elevation at x=y=0 is also 0. The best-fit sphere is also constrained to meet the surface in the center. Then, using MATLAB's lsqnonlin function, a sphere is fit to the elevations of the surface where the RoC of the sphere is the variable used for fitting. The "best-fit sphere" is the one that minimizes the sum of the squares of the difference between the array of elevation values for the surface and the elevation values of the sphere at the same (x,y) points.

Preferably, the freeform surface for optical surface 5B is predominately convex and more desirably, has convexity that is asymmetric around a center point in at least one direction and more preferably, is symmetrical in a first direction and asymmetric in a second direction that is orthogonal to the first. While the center point of the optical surface 5B can be the geometrical center point, the optical center point is preferred. For those surfaces that are asymmetric, it is preferable that the absolute difference in the average surface elevations from the base plane across (on either side of) the axis of asymmetry (the line that is normal to the axis of symmetry and passes through the optical center point) should be no more than 0.10.

The positioning of the display units 8 within AR system 1 is important. It must be located a vertical distance 24 above the level of the eyes (i.e. in front of the forehead), located outward (i.e. away the forehead based on the eye position) by another horizontal distance 13, located a distance 26 from the reflective surfaces of the visor, and must be tilted at an angle 6 so that the emitted light can be reflected off the visor 9 towards the pupil of the eye. Desirably, distance 24 is in the range of 8-20 mm and more preferably, in the range of 10-16 mm. This distance allows for display unit 8 to fit comfortably under a helmet but above the nose as well as allow for an unobstructed sky-view. Desirably, distance 13 is in the range of 10-30 mm and more preferably, in the range of 12-20 mm. This distance again allows the display 8 to fit under the edge of a helmet but is not so far as to cause torque which would be fatiguing. Desirably, the distance 26, as measured from the center point of the emissive surface 5B of the display unit 8 to the center point of the reflective section 9A1/9A2 of the visor 9, is in the range of 35-65 mm, and more preferably, in the range of 40-60 mm.

The tilt angle 6 of the display unit 8 is more problematic. The tilting of the display unit 8 will cause optical distortion. The more the display unit 8 is tilted, the more the reflected image will be distorted. Desirably, the angle 6 is in the range of −5 to 20 degrees and more preferably, in the range of 0-15 degrees. These angle ranges allow for suitable angling of the visor 9 while minimizing the number of optical distortions that need to be corrected. The less the display unit is tilted, the less the visor needs to be tilted; however, this also increases the optical pathway so the visor needs to be positioned further from the eye. Designs where the visor is further from the eye have less optical distortions due to the lower tilt angle of the visor, but this works against the desire to keep the visor small and unobtrusive. The more the display unit is moved up, the more the visor can be tilted; however, while the distance between the visor and the eye can be shortened, there will be more optical distortions and so, the visual acuity will decrease.

A very important component of AR system 1 is the visor 9, which is both curved and tilted. The visor 9 needs to be as transparent as possible in order for the user to observe the external world; however, there also needs to be reflective areas on the inner surface. The surfaces of these reflective areas need to be designed to correct for the optical distortions caused by the tilting of the display units 8 and the visor 9 in addition to creating a single combined image at the eyes that has the desired HFOV, VFOV and resolution. Moreover, the visor 9 also needs to provide protection to the face.

Overall, the external shape of the outer surface 9B of the visor 9 is roughly convex while the inner surface 9A is roughly concave. Its thickness is not necessarily constant, but will vary from 1-10 mm, and desirably between 2 and 4 mm. The distance 25 (the maximum distance from one end of the visor to the other end in the horizontal direction) is desirably in the range of 200-250 mm. In some embodiments, it can partially cover only one side of the face or more preferably, it curves around both sides of the face. The side edges (outside the direct line of vision) may be straight or curved. The distance 22 (the maximum distance between the top and bottom edges of the visor in the vertical direction) is desirably in the range of 70-130 mm. In some embodiments, it extends vertically as to cover the face from roughly the line of the eyebrows (or just below the bottom edge of a helmet) to roughly below the nose area, and possibly to the chin level in some embodiments. The visor 9 has a regular base curvature in at least one direction. Desirably, the radius-of-curvature (ROC) is in the range of 70-150 mm and more desirably, in the range of 80-120 mm. In some embodiments, the base ROC of the visor 9 is the same in both the horizontal and vertical directions. In other embodiments (i.e. see FIG. 3C), the reflective regions 9A1/9A2 each have their own ROC that is different from the remainder of the visor.

The visor 9 is desirably made from any suitable plastic material that meets the optical requirements. Some examples are PMMA or Polycarbonate (which is preferred). Alternatively, it can be made of glass, although this will add weight. Desirably, the visor 9 is formed as one integral unit; however, it may contain insets of the same or different materials. For example, reflective regions 9A1 and 9A2 may be manufactured separately using the same or different materials as the rest of the visor and then later joined together. Regions 9A1 and 9A2 are not mirrors that are totally reflective; in order to act as an AR device, they must allow for the passage of external light as well. Thus, 9A1 and 9A2 are only partially reflective (semi-reflective). In some embodiments, all or part (in particular, regions 9A1 and 9A2) of the inner surface of the visor may be treated in order to adjust the reflectivity. Like sunglasses, the entire visor or some portions of the visor may contain dyes to reduce the overall amount of light transmission. Alternatively, the outer surface 9B of the visor 9 may be treated to be partially reflective to create a mirror-like sunglass effect.

The visor 9 is tilted relative to the plane of the face in order to help maintain a short optical path from the display unit 8 to the eye without the need for any other optical component such as mirrors or other reflective components and to move the display outside the FOV of the eye. However, this will also cause additional optical distortions or aberrations. The visor tilt angle 10 should be in the range of 10-25 degrees and preferably, in the range of 15-20 degrees. The apparent side depth 11 of the visor, due to the curvature and tilt of the visor, should be in the range of 70-130 mm.

One important feature of the visor 9 is the distance 15 of the inner reflective surfaces of 9A1 and 9A2 to the pupils of the eyes. Desirably, 15 is in the range of 40-90 mm and more preferably, in the range of 50-80 mm. This distance allows for a compact system that sits close to the face. The optical pathlength of the image will then roughly correspond to diagonal distance between the center point of the display units 8 to the center points of reflective regions 9A1 and 9A2 plus the distance 15 (the distance between the inner reflective surfaces of the visor to the eye pupils). Desirably, the optical pathlength (corresponding to the sum of distances 26 and 15) is in the range of 80-130 mm. Desirably, the angle 14B that is formed between the principal light-rays along distances 26 and 15 is in the range of 20-50 degrees and more preferably, in the range of 30-40 degrees.

One critical feature of AR system 1 is the inner reflective surfaces of 9A1 and 9A2 of the visor 9. The tilting of both the display unit 8 and of the visor 9 will cause optical distortions that will reduce the HFOV, VFOV and resolution of the reflected image. These surfaces must be designed to correct these distortions. In particular, the aim image resolution requirements of being able to distinguish image features in a particular size range requires the pixel pitch of the display to be that same size range. In order to achieve the HFOV and VFOV aims while the visual acuity remains above the aim at the Nyquist cut-off limit corresponding to the pixel pitch, it has been found that the reflective surfaces of 9A1 and 9A2 must have an unusual complex freeform surface. In particular, it has a surface that whose surface elevations from a base plane change symmetrically on either side of a center line that runs through a center point in a first direction but changes asymmetrically on either side of a center line through the same center point in a second direction which is orthogonal to the first direction.

Each of the freeform reflective surfaces of 9A1 and 9A2 should generally appear (on a microscopic scale, looking towards the inner visor surface) as an asymmetric concave bowl that is sloping up on 3 sides, with one side with significantly less upward slope. That means in a first direction (i.e., parallel to the AofS or Axis of Symmetry) from the center point of the bowl (the lowest point), both sides have the same degree of curvature upwards (increasing slope) as the distance from a line passing through center point increases in that direction and so, the changes in shape are symmetrical across opposite sides of the center line (corresponding to the AofS). Thus, these symmetrical portions of the surface with increasing curvature will be concave in the first direction. However, in a second direction (i.e., parallel to the AofA or Axis of Asymmetry)) that is orthogonal to the first direction, one side (relative to the center line) has a curvature upwards (increasing slope/more elevation) as the distance from the center line increases (similar to the first direction), but on the other side of the center line in the second direction, the curvature has a smaller change so that the concave curvature upwards is less as the distance from the center line increases. Thus, in the second direction, the changes in shape are asymmetrical across opposite sides of the center line (corresponding to the AofA). The changes in asymmetry tend to be larger along the AofA line that passes through the center point. While the center point of the optical surface 9A1/9A2 can be the optical center point, it is preferred that it is the geometric center point. This particular unusual design for the freeform surface of 9A1 and 9A2 is necessary to enable the use of pixelated displays of certain size and pixel pitch ranges which maximizes the light emission while achieving aim HFOV, VFOV and visual acuity requirements.

The freeform surfaces of 9A1 and 9A2, on the inner surface of visor 9, are predominately concave (preferably 100% concave), as viewed from the eye, at a macro level with asymmetric variations in the degree of concavity on a micro scale. The degree of asymmetry in the freeform surface 9A1/9A2 can determined from the average of the surface elevations above a base plane. In a second (asymmetric) direction, the average of the surface elevations on either side of a center line AofA (Axis of Asymmetry; which will be in the first direction and passes through the center point) can be calculated. Because of the asymmetry in the second direction, the average of the surface elevations on either side of the AofA will be different from each other. It is desirable that the absolute value of the difference between the average surface elevations (on either side of a center line) in the asymmetric direction is in the range of 0.085 to 0.150 mm.

Alternatively, the freeform surfaces of 9A1 and 9A2 can be characterized using Zernike Polynomials. For example, see FIGS. 8A-8B. Of the 26 coefficients, Z5 and Z8 are the most important in terms of describing the portions of the surface that are less concave. It is preferred that the Z5 coefficient is in the range of −0.16 to −0.44 and the Z8 coefficient is in the range of 0.067 to 0.202 when the Zernike normalization radius ($R_{NORM}$) is within 5% of $R_{VISOR}$. $R_{NORM}$ defines the radius of a circle where the Zernike polynomials are orthogonal. $R_{VISOR}$ is the smallest radius of a circle about the center that encompasses the individual optical surface of 9A1 or 9A2.

The reflective surfaces of 9A1 and 9A2 should be left-right mirror images of each other in terms of size and shape to each other. The shape can approximate any regular shape such as a circle, an oval, a square or a rectangle. Rectangular shapes are preferred with a length between 45-60 mm and a width of 40-55 mm, so that it has an area of 1800-3300 $mm^2$ and preferrable 2400-2800 $mm^2$. Alternative shapes such as circles, ovals, or squares should be in the same area range. In order to provide the aim HFOV of 45 degrees and VFOV of 35 degrees, both 9A1 and 9A2 should each extend 45 and 35 degrees in the field-of-view as well. In some embodiments where even more HFOV is desirable, the shape of the effective reflective surfaces of 9A1 and 9A2 can extend out more towards the sides of the visor. In general, the non-emitting areas of the visor may extend to the sides beyond the image area so that the view of the scene is not partially through the visor and partially around the end of the visor.

Both 9A1 and 9A2 are located on the inner surface 9A and do not overlap. Desirably, both are surrounded on all sides by parts of the visor that are not involved in reflection of the image from display unit 8. The visor area outside the reflected display area could have optical coatings so that view of the scene within the reflected display area looks the same as the scene viewed through visor areas that is outside the reflected display area. The center points of both 9A1 and 9A2 desirably lie on the horizontal line of sight from the eye. The distance between the center points of 9A1 and 9A2 should be in the range of 45-80 mm.

External light is expected to pass through all areas of the visor 9, including reflective areas 9A1 and 9A2 located on the inner visor surface 9A. The ideal scenario is for a perfectly collimated beam of light entering the visor to exit as a perfectly collimated beam of light. Any deviations from a collimated beam exiting the visor results in a loss of acuity. Since the reflective areas 9A1 and 9A2 have a freeform surface meant to minimize optical distortions due to the tilting of the display unit 8 and visor 9, external light passing from the outer visor surface 9B through these areas will be affected and become distorted. This can be undesirable. Thus, it is desirable to modify the outer surface 9B opposite the inner areas 9A1 and 9A1. Thus, there are areas 9B1 and 9B2 on the outer visor surface 9B (corresponding to reflective areas 9A1 and 9A2 on the inner visor surface; see FIG. 3C) that can be used to minimize any optical distortions in the external light caused by passing through the reflective areas. Surfaces 9A and 9B will be roughly parallel, but the thickness of the visor may vary from place to place. The size and shape of 9B1 and 9B2 will correspond roughly to the size and shape of 9A1 and 9A2; however, there may be differences up to +/−20%. The surfaces of 9A1 and 9A2 have a certain freeform shape; it is desirable that corresponding areas 9B1 and 9B2 should have a similar freeform shape +/−20%. This will allow for overall minimized distortions in the external light passing through these areas. However, in some embodiments, it may not be necessary for 9B1 and 9B2 to correct for distortions in the external light passing through; in these cases, areas 9B1 and 9B2 will have a similar ROC as 9A1 and 9A2 or the remainder of the visor.

The term center point of the active area can refer to the geometric center point (i.e. as shown in FIGS. 5A-5B) or to the optical center point if different from the geometric center point. The optical center point on each surface is the location where the optical axis intersects that surface. This is often at the mathematical origin of the surface (x=y=0) and at the geometric center of the surface, but not in every case. An optical axis is defined as a line through the optical system that follows the optical axis ray, which is the ray that intersects the center of the aperture stop/pupils and the center of the field of view. Methods exist to find the optical center, including checking whether the origin of the mathematical surface prescription coincides with the optical center. For example, as generically shown in FIG. 5B for a rectangle, there is a vertical line y-y' and an orthogonal horizontal line x-x' through a geometric center point. These lines can correspond to the symmetry and asymmetry axes. Similarly, there can be orthogonal lines passing through the optical center which can correspond to the symmetry and asymmetry axes.

In some embodiments, the optical center of the active area will be located such that the axis of symmetry or the axis of asymmetry, both of which pass through the optical center, may not divide the active area into equal parts. That is, the active area of one side of an axis may have a different size from the area on the opposite side. This may affect the calculations of the average of the surface elevation on one side versus the other. In such cases, the calculation should be based on the same area size over the same relative location on both sides as reflected through the axis. This is done by only using the size of the smaller of the two areas for calculating the average in the larger area and not including the remainder of the larger area.

It should be noted that the average surface elevations in the first (symmetrical) direction can be different from either the average surface elevations in the second (asymmetric) direction. However, it would be desirable that the smaller of the average of the surface elevations in the second (asymmetric) direction would be similar to the average of the surface elevations in the first (symmetrical) direction; that is, the smaller of the average surface elevations (in the asymmetric direction) is preferably at least 80% of the average surface elevations in the symmetric direction, and more preferably, at least 90%.

The distances, angles and other physical parameters described within are based on an average size male head with a circumference of 58 cm. However, there can be variations in terms of head size; for example, the following are average circumferences based on height:

| Height | Circumference (cm) | |
|---|---|---|
| | Men | Women |
| 5 ft 1 inch | | 54 |
| 5 ft 2 inch | | 54.1 |
| 5 ft 3 inch | | 54.2 |
| 5 ft 4 inch | 53.6 | 54.4 |
| 5 ft 5 inch | 54.1 | 54.5 |
| 5 ft 6 inch | 55.1 | 54.7 |
| 5 ft 7 inch | 55.6 | 54.8 |
| 5 ft 8 inch | 56.6 | 55 |
| 5 ft 9 inch | 56.9 | 55.2 |
| 5 ft 10 inch | 57.2 | 55.4 |
| 5 ft 11 inch | 57.2 | 55.4 |
| 6 ft | 57.7 | 55.6 |
| 6 ft 1 inch | 58.2 | |
| 6 ft 2 inch | 58.4 | |
| 6 ft 3 inch | 59.2 | |

However, AR system 1 is designed to be mounted on a helmet which must be fitted to the head size. In terms of typical helmet sizes relative to head circumference, an XS=53-54 cm, S=55-56 cm, M=57-58 cm, L=59-60 cm, XL=61-62 cm and XXL=63-64 cm. In order to accommodate different system sizes, it may be necessary to proportionately change the absolute values for the distances, angles and other physical parameters in order to maintain the same relative relationships in the AR system.

Experimental Results

In the following set of experiments, optical designs were optimized using commercially available light-ray tracing software (CODE V). First, the initial geometric layout is constructed, where the visor surface is physically tilted such that, the display is outside the user's field of vision. Then, the shape of the reflective surfaces 9A1 and 9A2 of the visor is determined through spot size optimization to correct the aberrations that are generated by the tilted visor surface. In some embodiments, the shape of the emitting surface 5B of display unit 8 can also be an optimization variable that is instrumental in compensating for curvature of the field that would normally plague a system with a single concave mirror.

For the freeform optical surfaces that are asymmetric, it is important to be able to quantify the degree of asymmetry. This is accomplished using the difference in surface elevations between the freeform optical surface which will depend on direction. When the surface is symmetric in at least a first direction, the average surface elevation (sum total of surface elevation at each point/total number of points) above (concave surface) or below (convex surface) a two-dimensional base plane on either side of a center line (AofS) that is orthogonal to that first direction and runs through the center point can be calculated. If the surface is symmetrical in that direction, the average of the surface elevations on either side of the AofS will be the same. However, the surface elevations can also be asymmetric in a second direction that is orthogonal to the first direction. In such cases, at least one surface elevation at a point at some distance on one side of a center line AofA (Axis of Asymmetry) will be substantially different from the corresponding point at the same distance on the other side of the center line AofA (that passes through the center point). In an asymmetric case, the average of the surface elevations on one side of the center horizontal AofA line will be different from the average of the surface elevations on the opposite side of the AofA line and the surface is asymmetric in that second direction. The absolute value of the difference in average of the surface elevations on either side of an orthogonal center line is a measure of asymmetry in one direction. A larger value corresponds to a greater degree of asymmetry and a smaller value corresponds to reduced asymmetry. It should be noted that although lines AofS and AofA are shown as being vertical and horizontal in the Figures, they are not limited to these orientations so long as they are orthogonal to each other.

Visual acuity of the reflected image was determined via MTF plots based on using 24 field points using CODE V software. Because the FOV is rectangular and the eye-box size has a certain size range, the MTF will be different depending on direction. In the MTF plots, the results in the Sagittal (vertical) direction are dotted lines and the Tangential (horizontal) direction are solid lines. Visual acuity is judged using these MTF plots according to the Nyquist cut-off frequency. The Nyquist cut-off frequency is represented by a display pattern where two pixels corresponds to one cycle. In the case of 30.7 μm pixel pitch, the Nyquist cut-off frequency would be 16.2 cycles/mm. A display pattern is still visible as the contrast drops below 100%. However, at 20% contrast, the direction of the display pattern cannot be distinguished (i.e., the direction of the "tumbling E's" on the Snellen chart would not be distinguishable). The geometric mean (square root of the product) of the grouping of MTF plots at the 20% threshold was used to assess the visual acuity. The geometric mean should have a value of at least 20% (0.2 modulation) at the Nyquist cut-off. A Nyquist cut-off of 16 cycles/mm is equivalent to 20/40 vision.

Since the physical size of the AR system is important, the optical pathlength, particularly the distance between the eye and the inside of the visor (distance 15 in FIG. 3A) and the distance of the display unit 8 above the eye (distance 24 in FIG. 3A), should be as short as possible. Table 2 shows the effect of the distances 15 and 24 on the display pixel pitch and the resulting Nyquist cut-off spatial frequency.

TABLE 2

Effect of Optical Path Length on Display Pixel Pitch and Nyquist Cut-Off Frequency

| Example | Distance 15 | Distance 24 | Pixel Pitch (μm) | Nyquist Cut-Off |
|---|---|---|---|---|
| 1 | 60 | 15 | 30.7 | 16 cycles/mm |
| 2 | 65 | 20 | 33.7 | 15 cycles/mm |
| 3 | 70 | 20 | 35.8 | 14 cycles/mm |
| 4 | 75 | 20 | 38.5 | 13 cycles/mm |
| 5 | 70 | 25 | 36.3 | 14 cycles/mm |
| 6 | 75 | 25 | 38.3 | 13 cycles/mm |
| 7 | 80 | 25 | 41.1 | 12 cycles/mm |

The results in Table 2 shows that a shorter optical path (i.e. Example 1), which is desirable to maintain a smaller system size, has smaller display pixel pitch and a larger Nyquist cut-off frequency. Since shorter distances require more tilt in the display unit and the visor and also a smaller pixel pitch, it is much more challenging to design a compact system that meets the visual acuity requirements. However, using free-form surfaces on the visor, the aim visual acuity can still be achieved with a shorter optical path requiring smaller pixels.

Experimental Series A: In order to determine the effects of the design of surface 5B (emitting surface of the fiber optic faceplate 5) on visual acuity, three different surfaces were examined; A1 (toroidal surface with ROC=57.6 mm (horizontal direction) and 72.5 mm (vertical direction), A2 (spherical surface with ROC=60 mm) and A3 (Freeform Surface with base-sphere ROC=65 mm). The physical parameters (according to FIGS. 3A-3D) for Series A are listed in Table 3:

TABLE 3

| Physical Parameters for Experimental Series A | | |
|---|---|---|
| Parameter Type | Parameter | Value |
| P1 | 15 (Eye-to-Reflective Surface Distance) | 60 mm |
| P2 | 26 (Reflective Surface to Display Distance) | 48 mm |
| P3 | 13 (Distance of Display Out from Eye) | 15 mm |
| P4 | 24 (Distance of Display above Eye) | 15 mm |
| P5 | Horizontal FOV | 45 degrees |
| P6 | Vertical FOV | 35 degrees |
| P7 | Pupil Eye-box Diameter | 7 mm |
| P8 | Distance between Pupils | 64 mm |
| P9 | 10 (Visor Tilt) | ~17 degrees |
| P10 | 6 (Display Tilt) | ~5 degrees |
| P11 | 14A (Angle of Light from Display) | ~31 degrees |
| P12 | 14B (Angle of Reflected Light at Visor) | ~34 degrees |
| P13 | Size of Display 3 | 39 mm width × 34.1 mm height |
| P14 | # of Pixels in Display 3 | 1350 × 1050 |
| P15 | Pixel Pitch | 30.7 μm |
| P16 | Average ROC of Surface 5B | ~65 mm (freeform shape) |
| P17 | Size of Reflective Surfaces 9A1/9A2 | ~57 mm μ 49 mm |
| P18 | Best-fit ROC of Surfaces 9A1/9A2 | −99.167 mm |

Figure 6A:
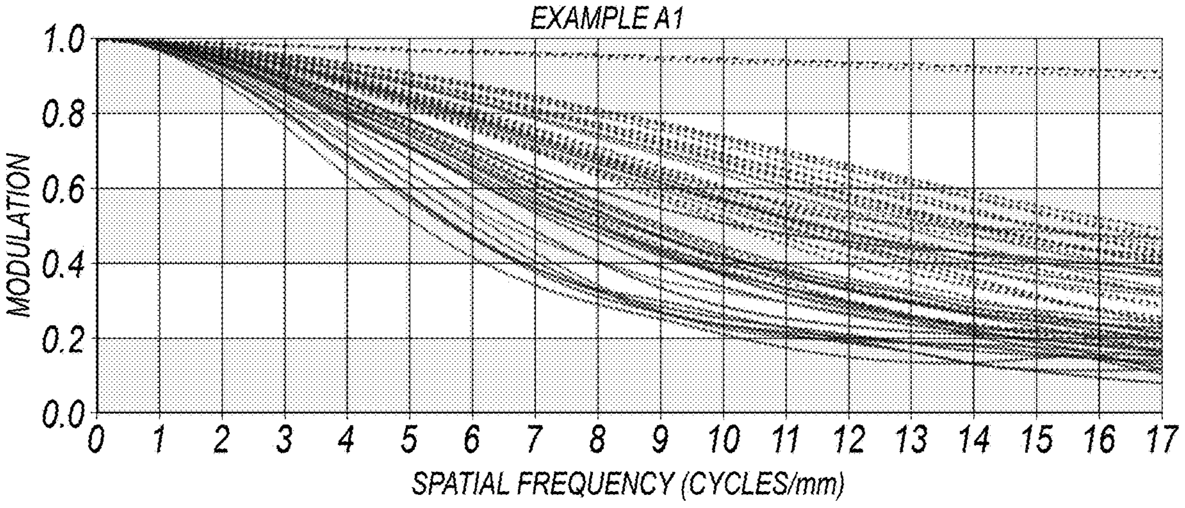
FIGS. 6A-6C show MTF plots for Experimental Examples A1-A3.
Figure 6B:
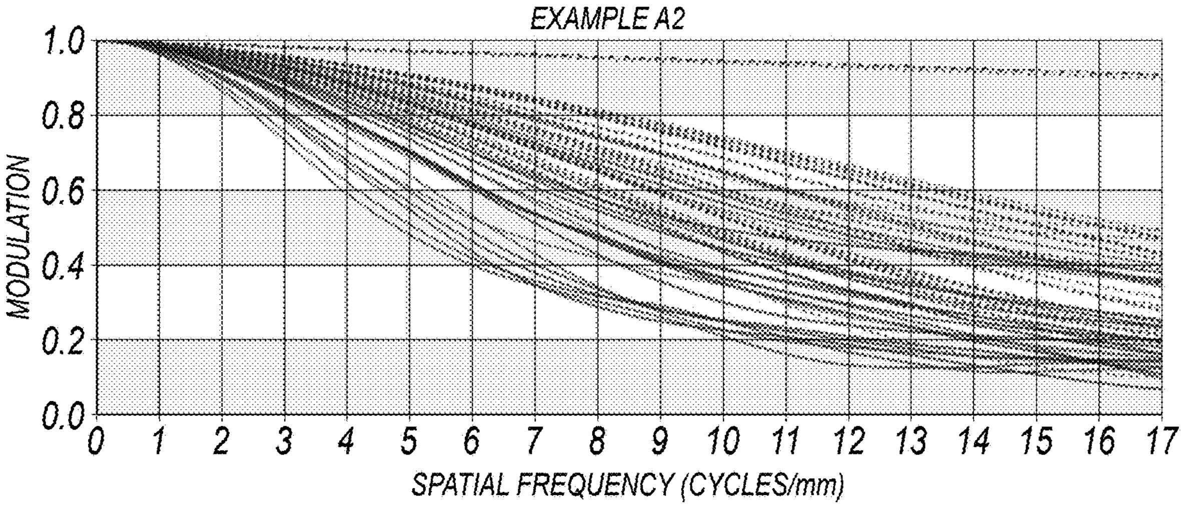
Figure 6C:
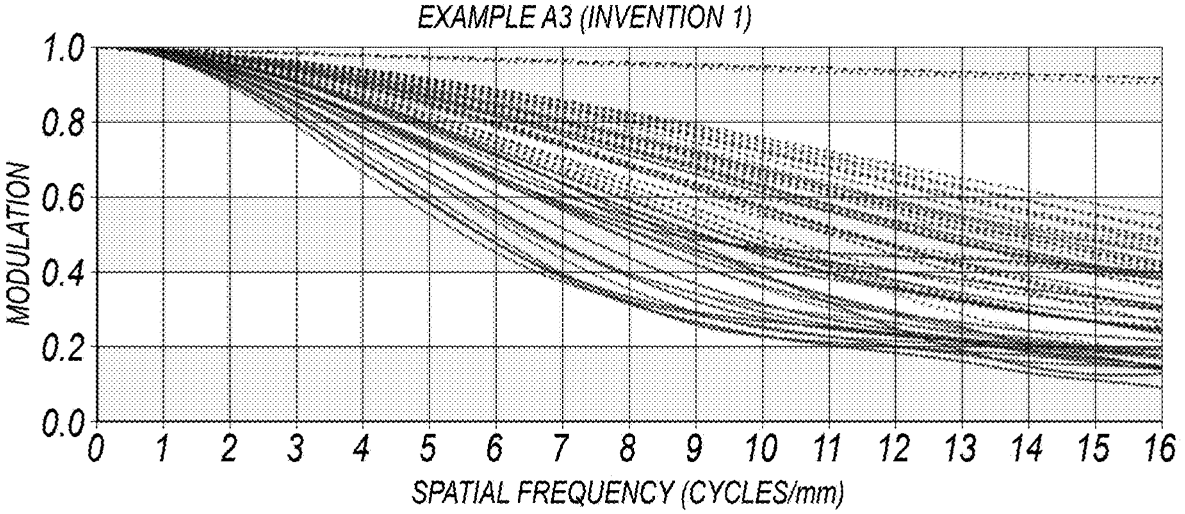

The resulting visual acuity (as MTF) for A1 (toroidal surface) is shown in FIG. 6A, for A2 (spherical surface) in FIG. 6B, and for A3 (freeform) in FIG. 6C. Note that A3 yields the best visual acuity.

Figure 7A:
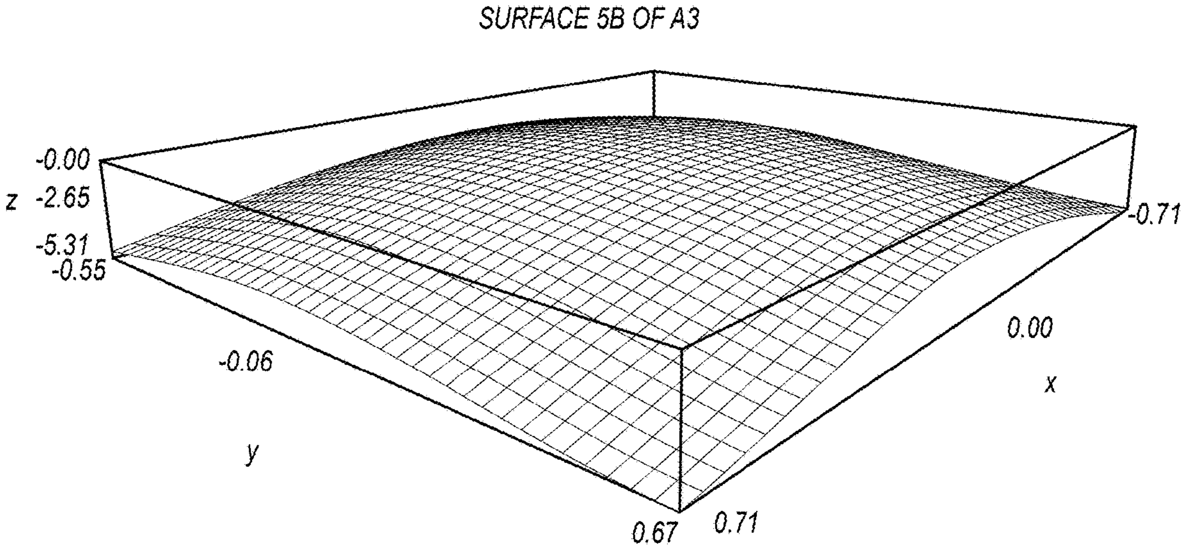
FIG. 7A is a 3D contour map of the emitting surface 5B in Example A3.
Figure 7B:
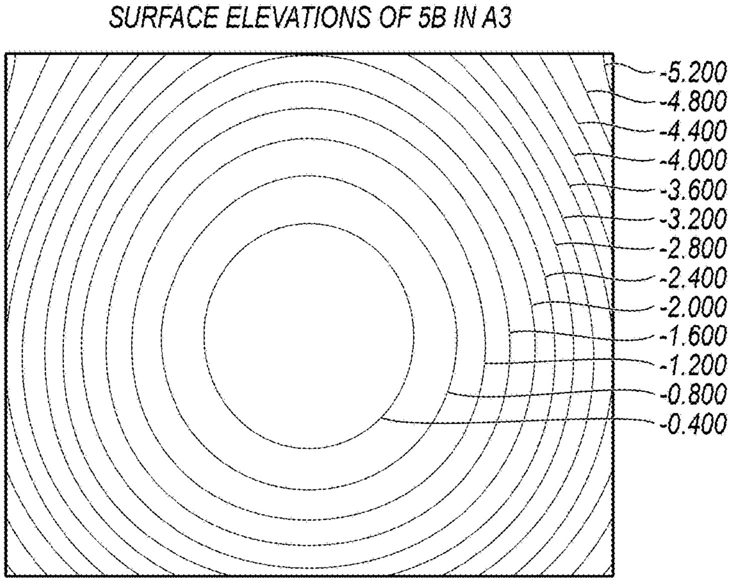
FIG. 7B is the corresponding 2D contour map from of the emitting surface 5B in Example A3.
Figure 7C:
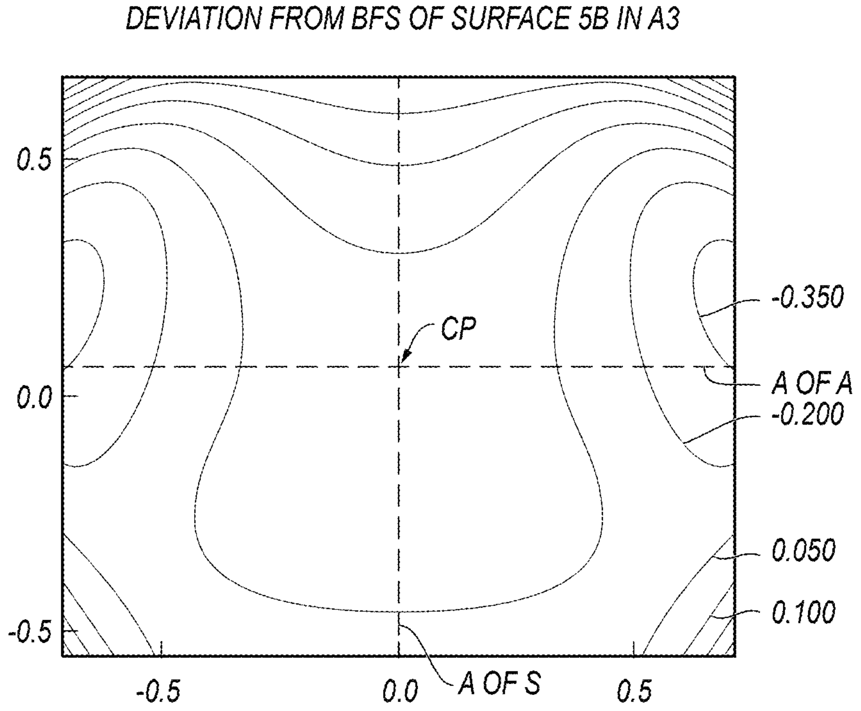
FIG. 7C is the contour map of the deviations between the surface 5B in A3 and its corresponding best-fit sphere.
Figure 7D:
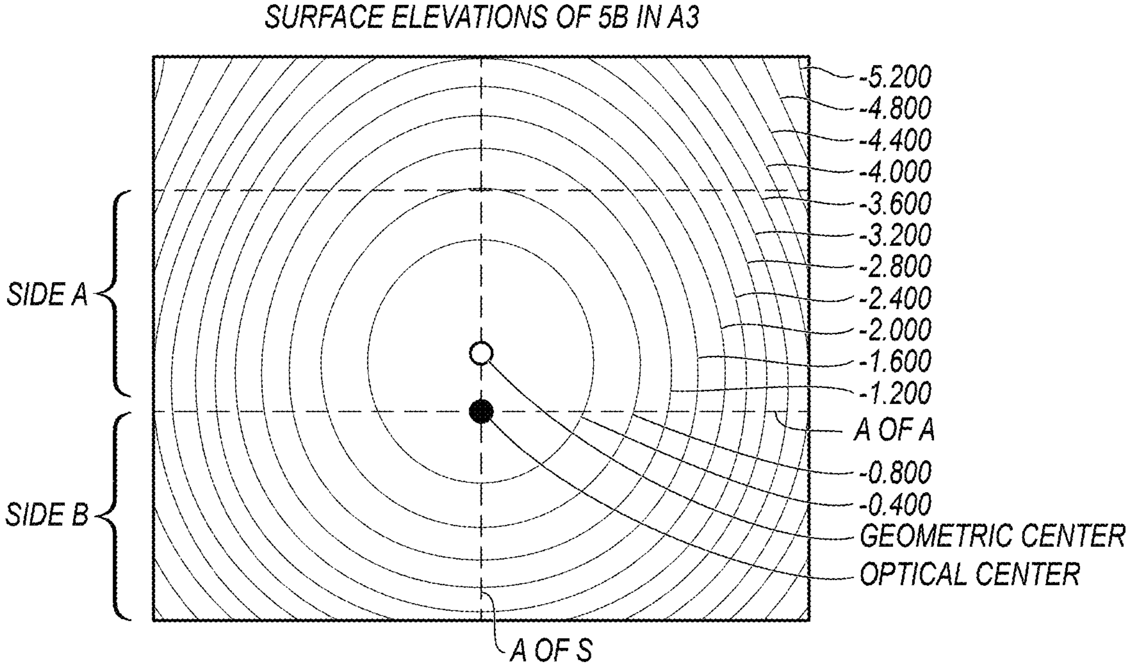
FIG. 7D is the same as FIG. 7B showing the relative locations of the geometric center point and the optical center point in surface 5B in A3.

FIG. 7A is a 3D contour map of the active area of the emitting surface 5B in Example A3. This 3D map shows the point-by-point elevation of the surface below a flat reference plane where the highest point is set to 0.0 on the reference plane. Thus, the elevations are negative. It has a rectangular emitting area of 39×34 mm which is the same as the size of the display 3. Note that this surface has a complex freeform shape but is generally convex. FIG. 7B shows the same surface elevations as 7A except as a 2D contour map. It is symmetric in a first direction but asymmetric in an orthogonal second direction; however, the changes are small but noticeable. However, these differences can be more easily seen in FIG. 7C, which shows the corresponding contour map of the point-by-point deviations between the surface 5B in A3 and the corresponding best-fit sphere. In FIG. 7C, the deviations are in mm and by convention, are negative for where the freeform surface 5B is below the best-fit sphere and positive for where the surface 5B is above the best-fit sphere. Note that on either side (left and right) of the AofS, the surface is symmetrical. However, on either side (top and bottom) of the AofA, the surface is asymmetric in that one side is different than the other. In the symmetric direction, the average surface elevation on both sides of the center line AofS was-1.98 mm. However, as illustrated in FIG. 7D, the optical center of surface 5B is not the same as the geometric center point in the asymmetric direction (along the AofS). If using the geometric center point to calculate the average surface elevation on either side of the AofA, the absolute difference between them is 0.26. However, using the optical center, the areas will have different sizes so the larger area (Side A) is adjusted by only using a portion that is the same size as Side B in the calculations and the area between the top edge of Side A and the edge of the active area not used in the calculation of the average. In this case based on the optical center, the absolute difference between the average of the surface elevations between Sides A and B is only 0.1.

The freeform surface 5B (as well as 9A1/9A2 in later experimental series) in A3 can also be described by using Zernike polynomials as listed in FIGS. 8A and 8B based on the following equation:

$$z(x, y) = \frac{c\rho^2}{1 + \sqrt{1 - (1 + k)c^2\rho^2}} + \sum_{j=1}^{21} C_j Z_j$$

where:

| | |
|---|---|
| z | The sag of the surface along the z-axis as measured from the plane of the vertex |
| z | The curvature of the surface (also seen as the curvature, $R_{curv} = 1/c$) |
| k | Conic constant |
| ρ | The radial component ($\rho^2 = x^2 + y^2$) |
| $C_j$ | The jth Zernike Coefficient |
| $Z_j$ | The jth Zernike Polynomial as defined by the FRINGE ordering |

It should be noted that the Zernike polynomials, $Z_j$, are functions of a radial component R and an angular component Θ where R is a normalized quantity, $R=\rho/R_{norm}$ where $R_{norm}$ is the normalizing radius. The units are in mm.

Experimental Series B: In order to examine the effects of display size, the following experimental examples were compared. In all these designs, the pixel size was constant at 30.7 um, so the Nyquist Spatial Cut-Off frequency was constant at about 16 cycles/mm. Table 4 shows the changes in parameters used for comparative examples B1-B6 to be compared to Invention A3.

TABLE 4

| Physical Parameters for Experimental Series B | | | | | | |
|---|---|---|---|---|---|---|
| Parameter | B1 | B2 | B3 | B4 | B5 | B6 |
| P1 | 60 | 48 (−20%) | 60 | 60 | 60 | 77 (+28%) |
| P2 | 41 | 35 | 55 | 56 | 61 | 63 |
| P9 | 16.3 | 20 | 17.5 | 24 | 15.2 | 15.5 |
| P10 (Degrees) | 16 | 30.8 | 35.3 | 40.8 | 27 | 28 |
| P13 (mm) | 31.5 × 24.5 (−30%) | 31.5 × 24.5 (−30%) | 50.7 × 44.3 (+30%) | 50.7 × 47.7 (+30%) | 50.7 × 52 (+30%) | 50.7 × 43.5 (+30%) |

TABLE 4-continued

| Physical Parameters for Experimental Series B | | | | | | |
|---|---|---|---|---|---|---|
| Parameter | B1 | B2 | B3 | B4 | B5 | B6 |
| P14 | 890 × 798 | 890 × 798 | 1651 × 1444 | 1651 × 1554 | 1651 × 1368 | 1651 × 1417 |
| P15 | 30.7 | 30.7 | 30.7 | 30.7 | 30.7 | 30.7 |
| P16 | 30 | 36 | 368 | 112 | 83 | 79 |
| P18 | 76 | 70 | 126 | 116 | 122 | 126 |

Figure 9A:
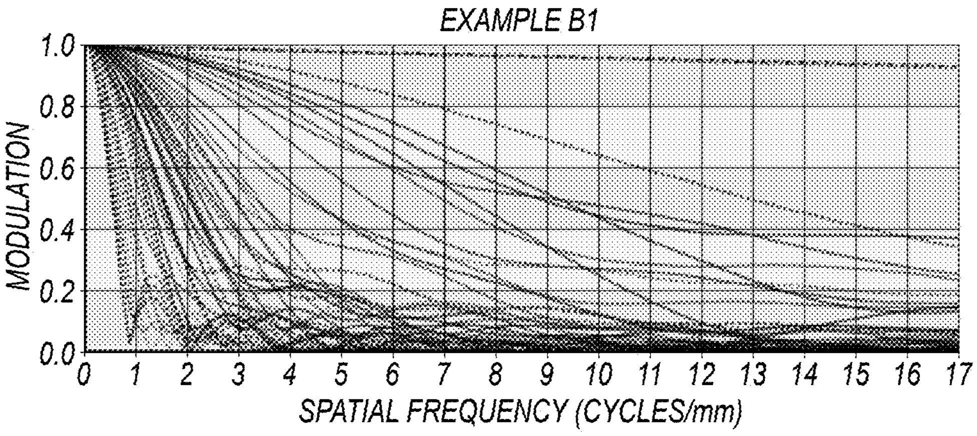
FIGS. 9A (Comparison B1), 9B (Comparison B2), 9C (Comparison B3), 9D (Comparison B4), 9E (Comparison B5) and 9F (Comparison B6) are MTF plots that show the effects of reducing display size on visual acuity.
Figure 9B:
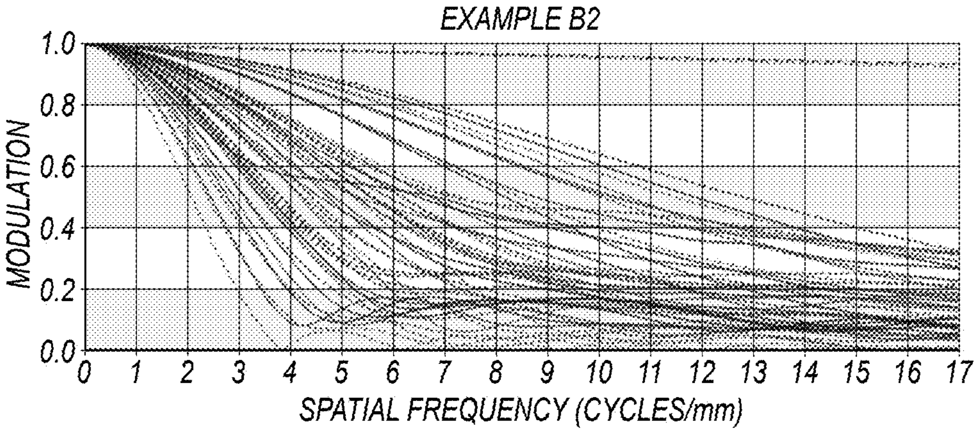

In comparison B1 the display size has been reduced by 30% compared to Inventive example A3 so that it is outside the desired range. The bottom of the display is approximately in the same spot as in A3. The MTF is shown in FIG. 9A, which shows the visual acuity is poor. Comparison B2 is like B1 but where the visor is moved closer to both the eye and display unit in order to improve the focus at the eye-box. The MTF is shown in FIG. 9B, which shows that although the visual acuity is somewhat improved, it still remains poor.

Figure 9C:
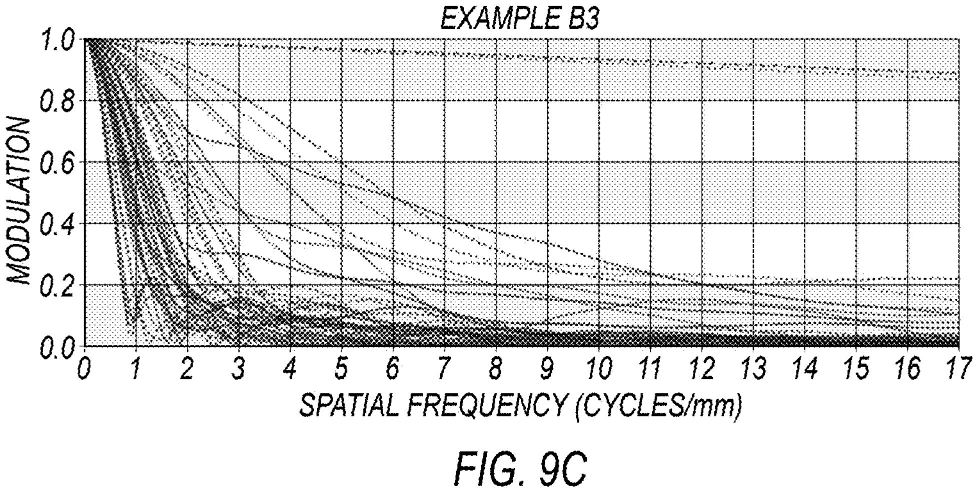
Figure 9D:
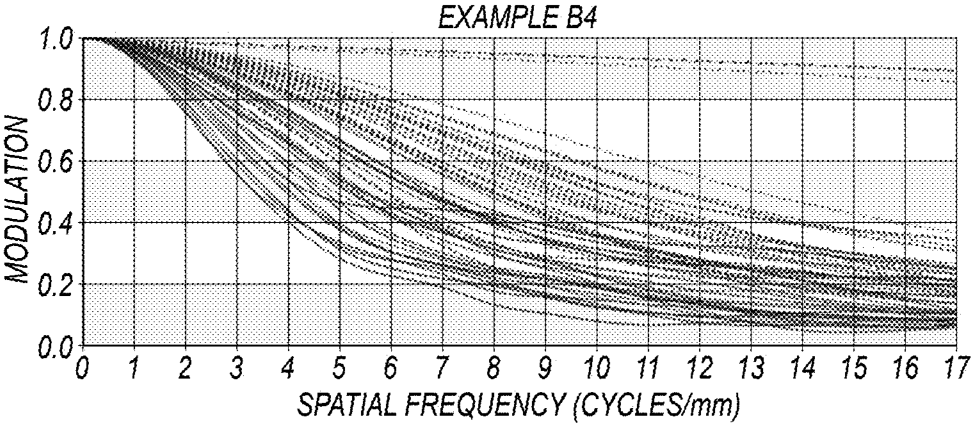
Figure 9E:
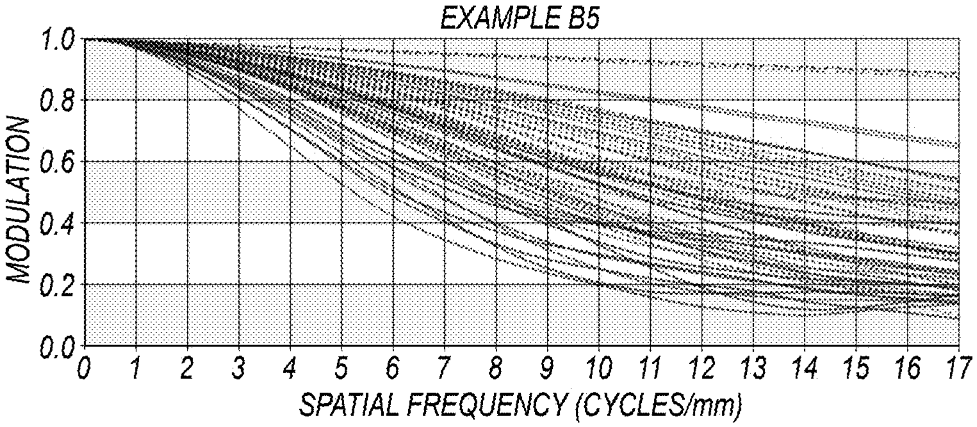
Figure 9F:
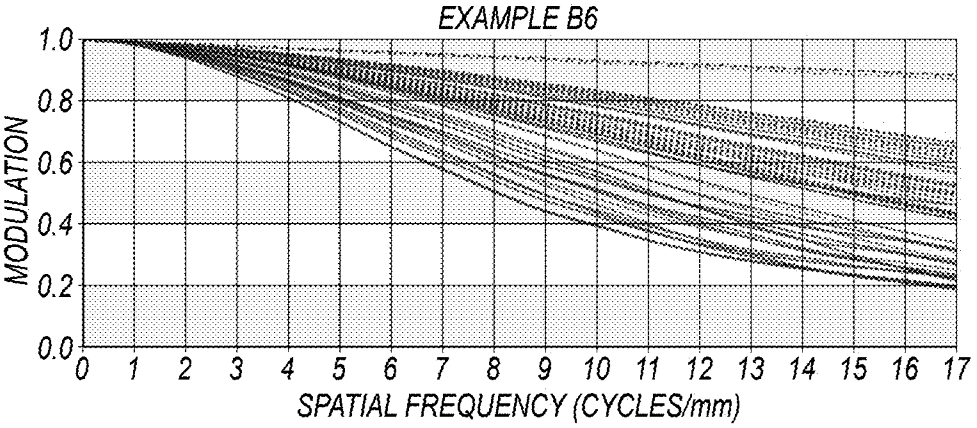

In comparison B3 the display size has been increased by 30% compared to A3 (Invention 1) so that it is outside the desired range. The bottom of the display is approximately in the same spot as in Invention 1. The MTF is shown in FIG. 9C, which shows the visual acuity is poor. Comparison B4 is like B3 but the display is moved upwards, but not closer to the visor. This helps with focusing. The MTF is shown in FIG. 9D, which shows that although the visual acuity is somewhat improved, it still remains insufficient. Comparison B5 is like B3 but the display is allowed to move further from the visor to get to a better focus spot. Even though the visual acuity is good (see FIG. 9E), the display is now inside the forehead. Comparison B6 is like B3 but the eye-to-visor distance and the display location are both allowed to vary so that the display can move to a spot where the light is in better focus and so that the display is spaced apart from the forehead. While the visual acuity is good (see FIG. 9F), the increase in the eye-to-visor distance causes the visor to stick out too far from the face.

These results from Series B indicate that if the size of the display is smaller than the desired range, the visual acuity is poor and if the display size is larger than the desired range, the visual acuity is poor and if the system is adjusted to obtain better visual acuity, the physical size of the system becomes impractical.

Experimental Series C: In order to examine the effects of pixel pitch and display size, the following experimental examples were compared. Table 5 shows the changed parameters used for comparative examples C1-C4 to be compared to Invention 1 (A3).

TABLE 5

| Physical Parameters for Experimental Series C | | | | | |
|---|---|---|---|---|---|
| Parameter | C1 | C2 | C3 | C4 | A3 |
| P1 (mm) | 60 | 60 | 60 | 39 | 60 |
| P2 (mm) | 65 | 72 | 30 | 27 | 48 |
| P3/P4 (mm) | 15 | −10 | 33 | 15 | 15 |
| P9 | 30 | 14 | 27 | 23.3 | 17 |
| P10 | 42 | 25 | 31.3 | 36.1 | 31 |
| P13 | 62.2 × 48.4 | 62.2 × 48.4 | 20.7 × 16.1 | 20.7 × 16.1 | 39.0 × 34.1 |
| P14 | 1350 × 1050 | 1350 × 1050 | 1350 × 1050 | 1350 × 1050 | 1350 × 1050 |
| P15 | 46.1 | 46.1 | 15.4 | 15.4 | 30.7 |
| P16 | 95 | 104 | 15 | 41 | 41 |
| P18 | 129 | 145 | 58 | 53 | 96 |

In Series C, it should be noted that if the number of pixels is held constant (necessary to maintain resolution), changes in pixel pitch will result in changes in display size as well.

Figure 10A:
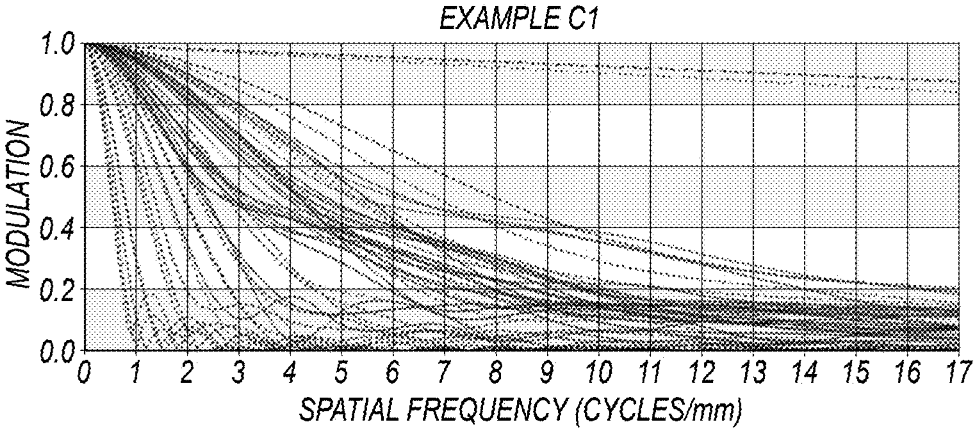
FIGS. 10A (Comparison C1), 10B (Comparison C2), 10C (Comparison C3) and 10D (Comparison C4) are MTF plots that show the effects of varying pixel pitch on visual acuity.

In Comparison C1, the pixel pitch of the display is increased by 50% (compared to Invention A3. This increases the focal length and so, the display unit is shifted upward which in turn, requires the visor to become highly tilted. This results in very bad visual acuity (see FIG. 10A).

Figure 10B:
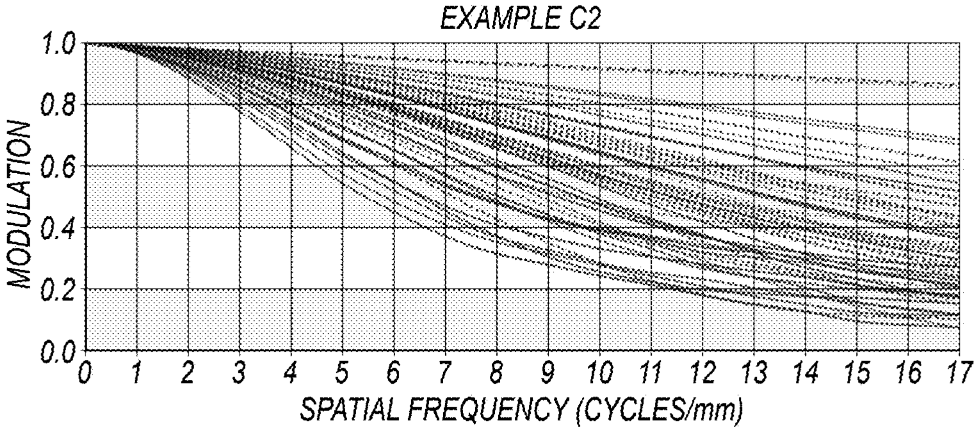

Comparison C2 is like C1 (where the eye-to-visor distance is held constant), but the position of the display unit is changed in order to decrease the visor tilt angle. This results in good visual acuity (see FIG. 10B), but the distance necessary is such that the display unit would be located inside the head.

Figure 10C:
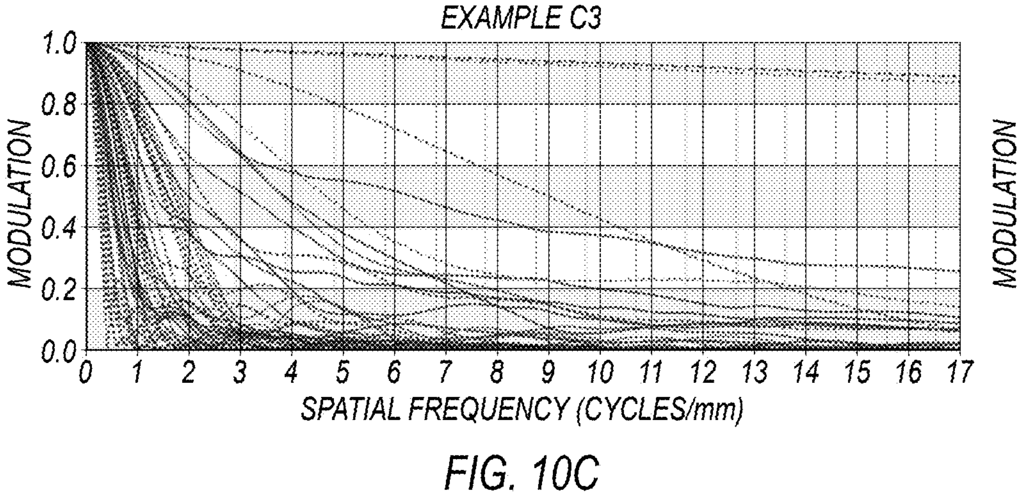

Comparison C3 is where the pixel pitch of the display is decreased by 50% (compared to Invention 1=A3). In this case, the smaller display requires the visor to have a short focal length, which causes the location of the best focus to be near the visor. In order to obtain any results, the eye-to-visor distance is maintained at 60 mm and the display moved closer to the visor. However, this blocks any external view above the reflected image (i.e., a "sky-view"). In this case, the visor becomes very curved and highly tilted, so the visual acuity is very poor (see FIG. 10C).

Figure 10D:
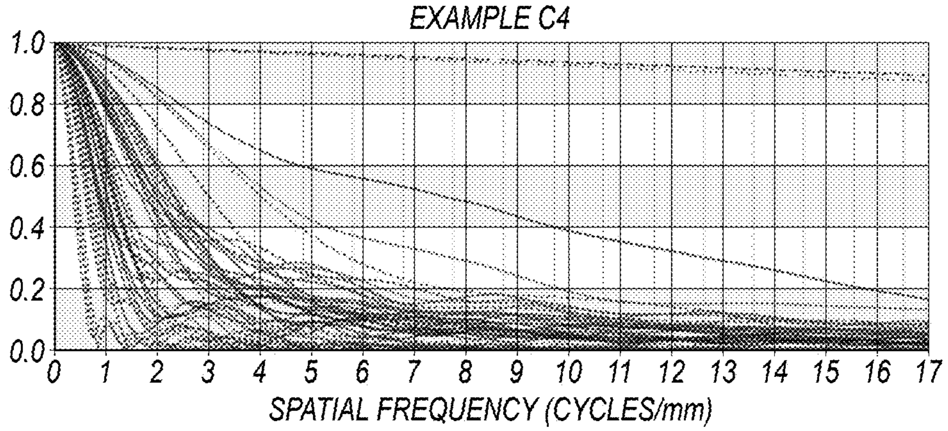

Comparison C4 is like C3 but the eye-to-visor distance was decreased so the that the external sky-view requirement could be met. In this case, the visual acuity is still very bad (see FIG. 10D).

Experimental Series D: This set of experiments pertain to the freeform surfaces of 9A1 and 9A2 which are generally concave (as viewed from the eye). In particular, it is important to be able to quantify the degree of asymmetry in these surfaces. Variations were mathematically modelled based on the same set of base parameters as listed for A3 in Series A. Other design parameters for the associated visor surfaces 9A1 and 9A2 are (in mm) $R_{NORM}$=36 and Rbs (radius of base sphere)=−96.43. In the maps, the rectangular box outline corresponds to the size of reflective areas 9A1 and 9A2.

In Table 6, the surface deviations on either side of the AofS or the AofA are averaged. If a surface is symmetric, the average surface elevations on either side of a center line (AofS) that passes through a center point will be the same on both sides. Note that the AofS will be orthogonal to the first symmetric direction. If the surface is asymmetric, the average surface elevations on either side of a center line (AofA) that passes through a center point will be different. Note that the AofA will be orthogonal to the second asymmetric direction. Sides A and B refer to the area of the optical surface that lies on either side of a center line (AofA) that lies in the first (symmetric) direction that passes through the center point. Thus, sides A and B lie along the second (asymmetric) direction. The averages of the surface elevations on either side of the AofS or AofA are calculated independently; the difference between them is listed as the absolute value in mm.

TABLE 6

| Differences in Average Surface Elevations | | | | |
|---|---|---|---|---|
| Example | Avg. Surface Elevation (AofS) | Avg. Surface Elevation (Side A of AofA) | Avg. Surface Elevation (Side B of AofA) | Difference (A-B) |
| D1 (Comp) | 2.42 = 2.42 | 2.42 | 2.42 | 0.00 |
| D2 (Comp) | 2.45 = 2.45 | 2.35 | 2.53 | 0.18 |
| D3 (Comp) | 2.43 = 2.43 | 2.40 | 2.46 | 0.06 |
| D4 (Comp) | 2.47 = 2.47 | 2.26 | 2.69 | 0.43 |
| A3 (Invention 1) | 2.44 = 2.44 | 2.38 | 2.50 | 0.12 |

As demonstrated in Table 6, all of the examples are symmetric in a first direction (parallel to the AofA) but asymmetric in a second direction (parallel to the AofS). Only the inventive example A3 has a difference in asymmetry in the desired range of 0.085 to 0.150 mm.

Figure 11:
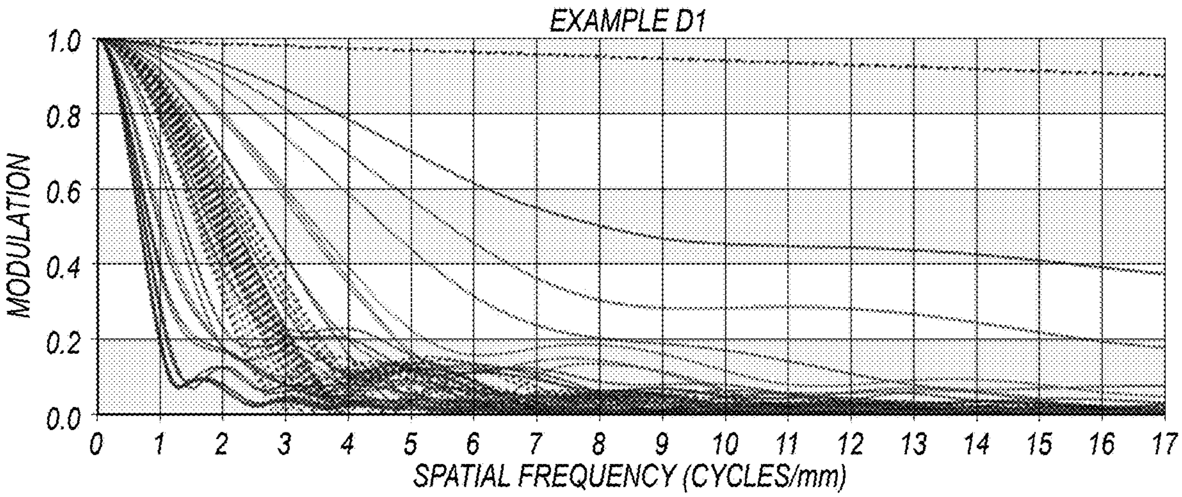
FIG. 11 is the MTF plot for D1.

In comparison D1, the reflective optical surfaces of 9A1 and 9A2 were according to a regular concave base-sphere with a radius-of-curvature of −96.43 mm (Rbs) and so, 9A1 and 9A2 are symmetrical in both the first and second directions. This represents an example of a reflective surface that is neither freeform nor asymmetric. As shown in corresponding MTF plot (see FIG. 11), there is effectively no visual acuity at a Nyquist cut-off frequency of 16 cycle/mm. The user would only be able to distinguish features that were at least 200 μm wide, which is about 7× larger than the aim visual acuity (30 μm).

Figure 12:
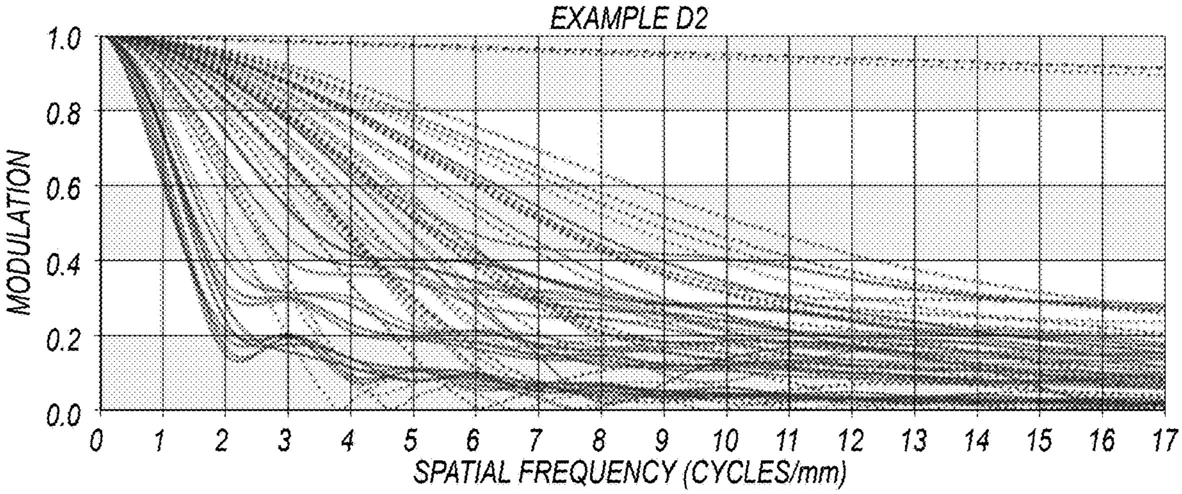
FIG. 12 is the MTF plot for D2.

In comparison D2, the reflective optical surfaces of 9A1 and 9A2 were similar to that in A3 (Invention 1) but where the Z5 and Z8 Zernike coefficients were increased by 1.5× from A3 (see FIGS. 8A-8B for the listing of Zernike coefficients for A3). This results in a freeform surface that remains symmetrical in a first direction and asymmetrical in a second direction but with a smaller difference in average surface elevation in the asymmetric direction than A3. The corresponding MTF plot is shown in FIG. 12. There is effectively no visual acuity at a Nyquist cut-off frequency of 16 cycle/mm. The user would only be able to distinguish features that were at least 200 μm wide, which is about 7× larger than the aim visual acuity (30 μm).

Figure 13:
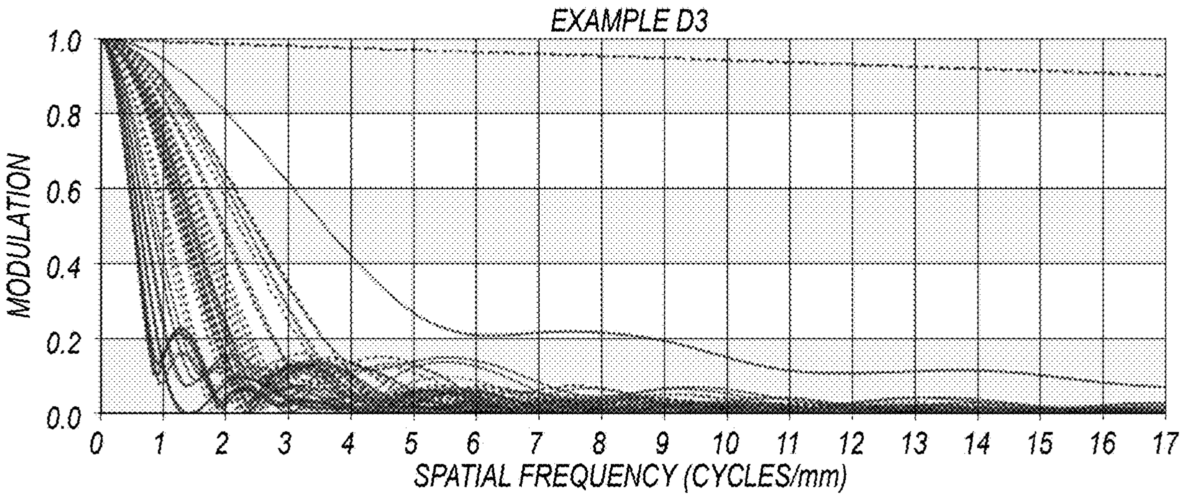
FIG. 13 is the MTF plot for D3.

In comparison D3, the reflective optical surfaces of 9A1 and 9A2 were similar to that in A3 (Invention 1) but where the Z5 and Z8 Zernike coefficients were decreased by 0.5× from A3. This results in a freeform surface that remains symmetrical in a first direction and asymmetrical in a second direction but with a smaller difference in average surface elevation in the asymmetric direction than A3. The corresponding MTF plot is shown in FIG. 13. There is effectively no visual acuity at a Nyquist cut-off frequency of 16 cycle/mm. The user would only be able to distinguish features that were at least 200 μm wide, which is about 7× larger than the aim visual acuity (30 μm).

Figure 14:
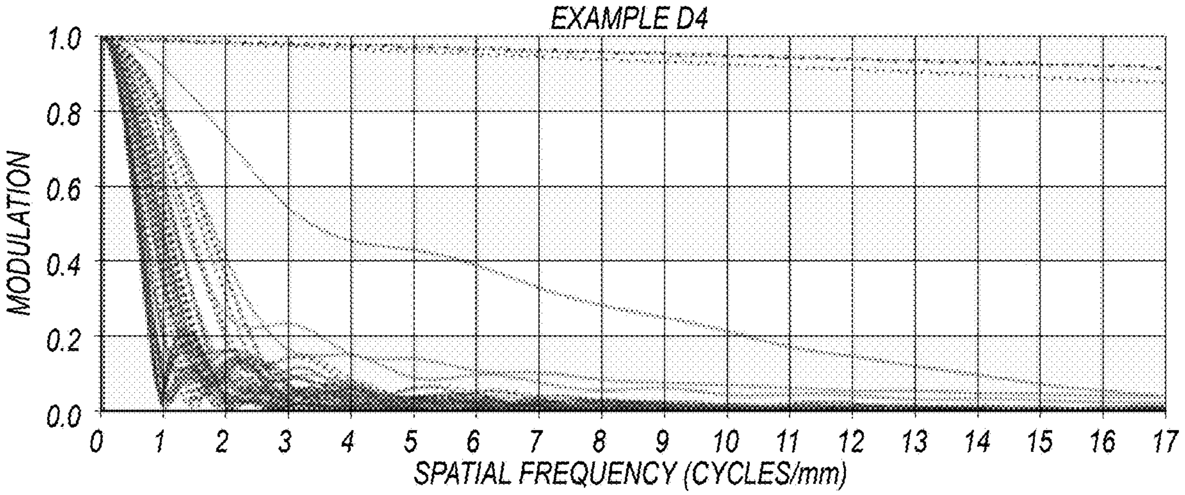
FIG. 14 is the MTF plot for D4.

In comparison D4, the reflective optical surfaces of 9A1 and 9A2 were similar to that in A3 (Invention 1) but where the Z5 and Z8 Zernike coefficients were increased by 3.5×. This results in a freeform surface that remains symmetrical in a first direction and asymmetrical in a second direction but with a larger difference in average surface elevation in the asymmetric direction than A3. The corresponding MTF plot is shown in FIG. 14. There is effectively no visual acuity at a Nyquist cut-off frequency of 16 cycle/mm. The user would only be able to distinguish features that were at least 360 μm wide, which is about 12× larger than the aim visual acuity (30 μm).

Figure 15A:
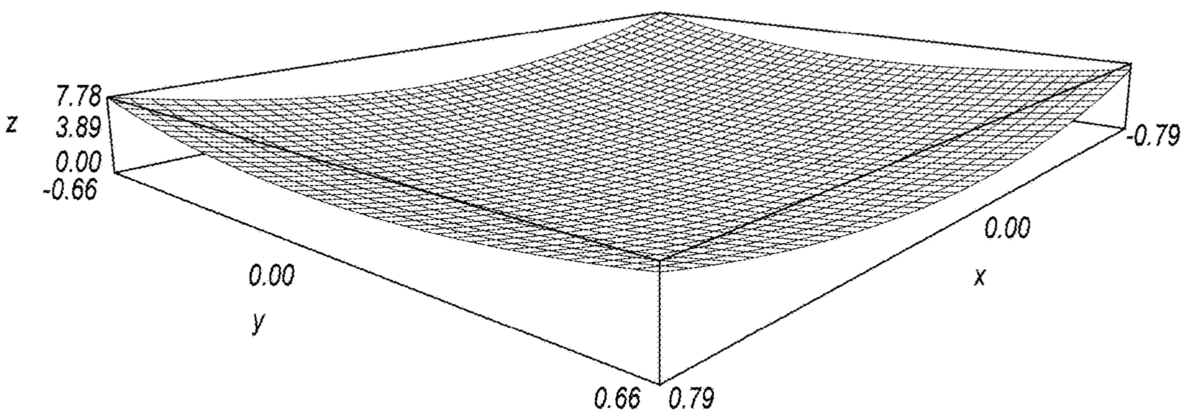
FIG. 15A is a 3D contour map of the reflective surfaces 9A1/9A2 in Example A3 (Invention 1).
Figure 15B:
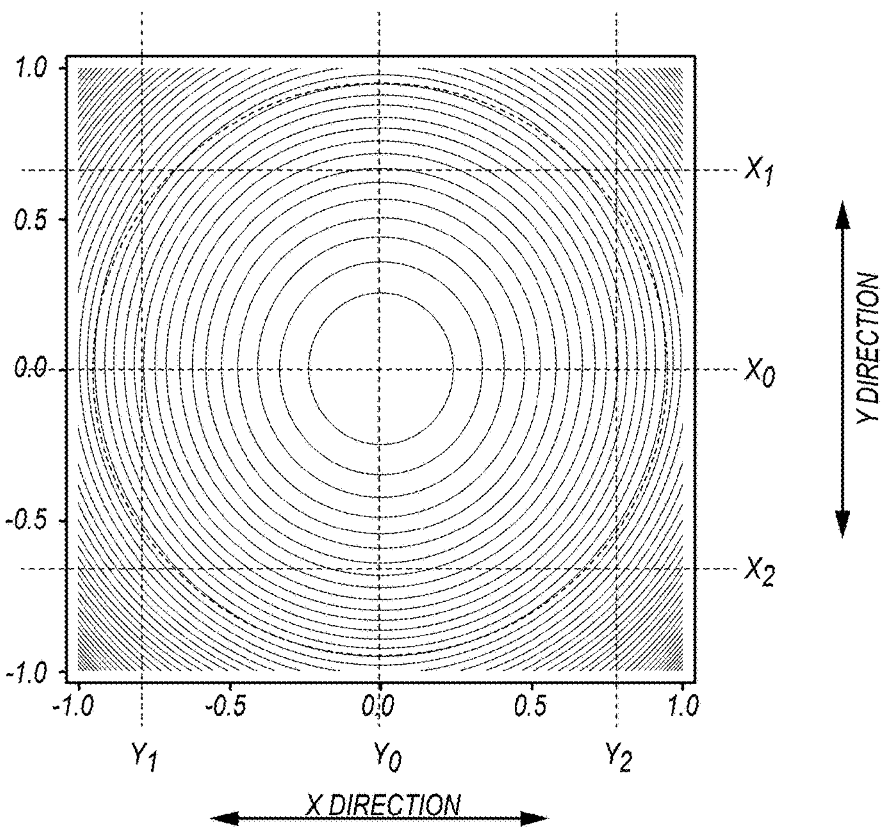
FIG. 15B is the corresponding 2D contour map of the reflective surfaces 9A1/9A2 in Example A3 (Invention 1).
Figure 15C:
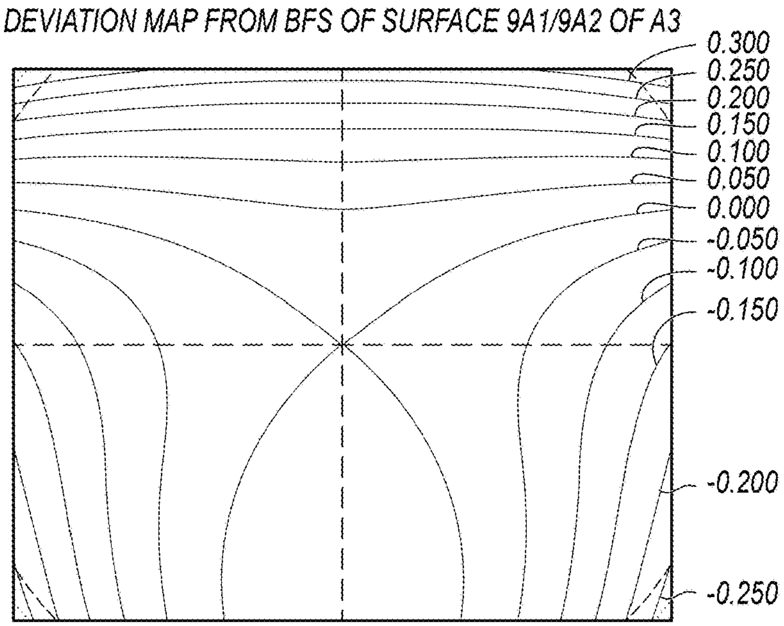
FIG. 15C is the contour map of the deviation between the surface 9A1/9A2 in A3 and its corresponding best-fit sphere.

FIG. 15A is a 3D contour map of the reflective surfaces 9A1/9A2 in Example A3 (Invention 1). Although freeform, this surface appears to be concave in shape. FIG. 15B is the corresponding 2D contour map of the same surface. In both views, the freeform changes are too small to be readily seen in these figures. FIG. 15C is a contour map of the deviations of the 9A1/9A2 surface from the corresponding best-fit sphere that clearly shows that in A3, the surfaces of 9A1/9A2 are symmetric in one direction but asymmetric in an orthogonal direction.

To illustrate the changes in the surface as shown in FIG. 15B, three cross-sections were made in the x direction at $X_0$ (where y=0) and at either end of the active area ($X_1$ and $X_2$ where y remains a constant value) along with three cross-sections in the y direction at $Y_0$ (where X=0) and at either end of the active area ($Y_1$ and $Y_2$ where x remains a constant value). In this Figure, the $X_0$ line is the axis of asymmetry (AofA) and $Y_0$ is the axis of symmetry (AofS). This creates 2D curves of the surface at those particular locations.

Figure 15D:
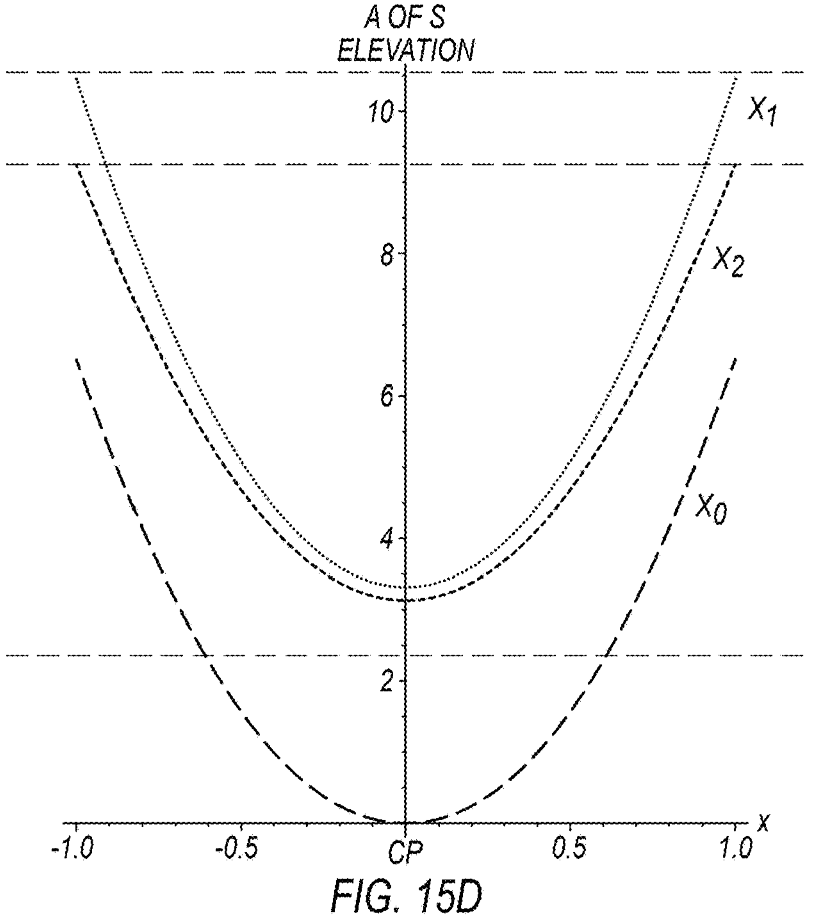
FIG. 15D shows three slices of the active area surface of 9A1/9A2 in A3 in the symmetric direction.

FIG. 15D shows the resulting 2D cross-sections in the x or the symmetric direction at three locations ($X_1$ (at y=0.66), $X_0$ (AofA at y=0), and $X_2$ (y=−0.66). Along the $X_0$ line, which passes through the 0,0 geometric center point, the relative elevation (in terms of y) of the surface 9A1/9A2 increases from the corresponding base plain as the distance from the CP increases in all three cross-sections. Along the $X_1$ and $X_2$ lines (at the "top" and "bottom" of the active area), the relative elevation of the surface 9A1/9A2 is greater than along $X_0$. Although the surface has different elevations along $X_1$, $X_0$ and $X_2$, the elevations in the symmetric direction are the same on either side of the CP (see Table 7). That is, at the same distance from the CP along the x axis, the elevation of the surface is the same and so, either side along the $Y_0$ line (AofS) are mirror images and so, this surface is symmetrical in this direction. This is illustrated by the dotted lines, which are parallel to the baseline x, that intersect the lines at the same height at the same distance on either side of the AofS ($Y_0$ which is orthogonal to the AofA, $X_0$)

Figure 15E:
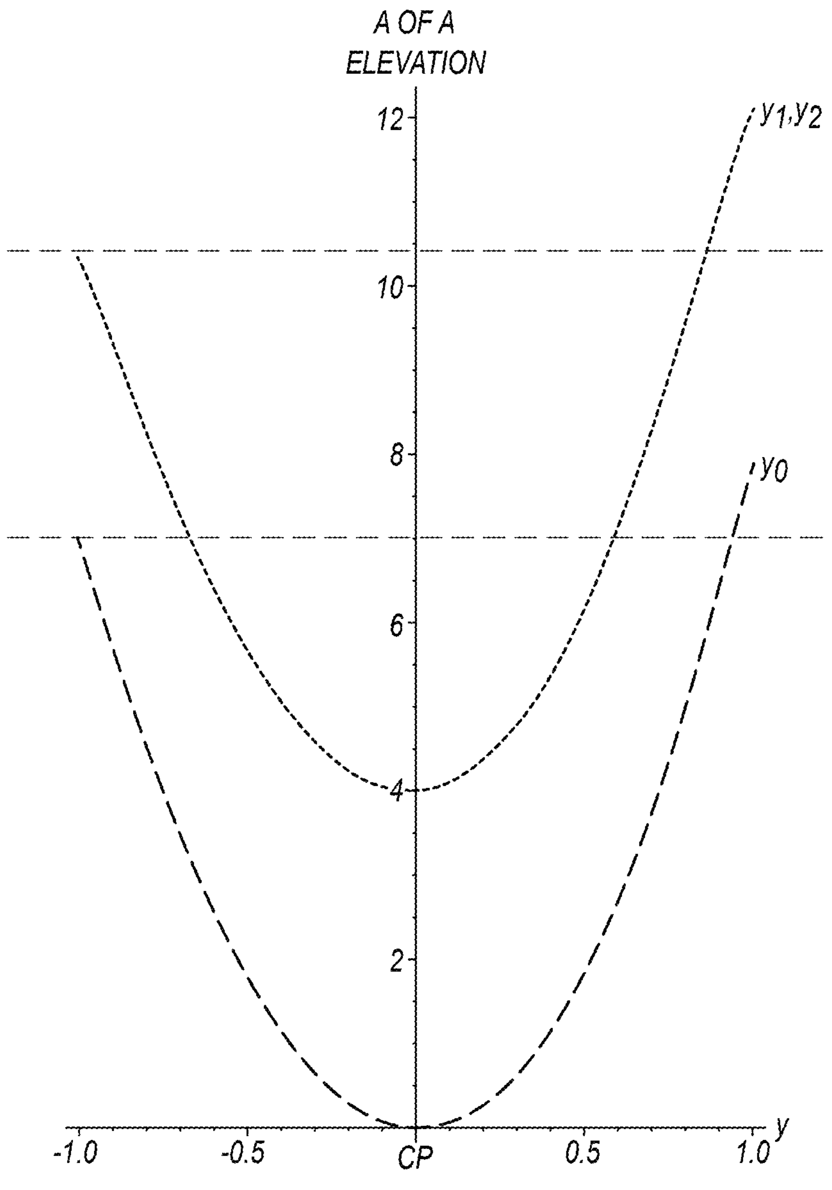
FIG. 15E shows three slices of the active area surface of 9A1/9A2 in A3 in the asymmetric direction.

FIG. 15E shows the resulting 2D cross-sections in the y or the asymmetric direction at three locations ($Y_1$ (x=−0.79), $Y_0$ (AofS at x=0) and $Y_2$ (x=0.79)). Along the $Y_0$ line, which passes through the 0,0 geometric center point, the relative elevation (in terms of x) of the surface 9A1/9A2 increases on one side (the left side as illustrated) as the distance from the CP increases. However, on the other side (the "right" side as illustrated) of the CP, the relative elevation of the 9A1/9A2 surface still increases but as a different rate compared to the opposite side of the $y_0$ line (see Table 7). Thus, surface 9A1/9A2 is asymmetric around the center point along $Y_0$. The $Y_1$ and $Y_2$ lines are the surface at the sides of the active area overlap and so are the same. However, as for the $Y_0$ line, both are less on one side (the "left") of the CP compared to the opposite side (the "right") as indicated by the dotted lines intersecting the surface at different heights at the same distance from the AofA ($X_0$, which is orthogonal to the AofS, $y_0$).

TABLE 7

| Surface Elevations of (A1/9A3 in A3 (Inventive Sample 1) | | | | | | |
|---|---|---|---|---|---|---|
| | x direction (Symmetric) | | | y direction (Asymmetric) | | |
| Distance | −x | +x | Difference | −y | +y | Difference |
| 0% (CP) | 0 | 0 | 0 | 0 | 0 | 0 |

TABLE 7-continued

| Surface Elevations of (A1/9A3 in A3 (Inventive Sample 1) | | | | | | |
|---|---|---|---|---|---|---|
| | x direction (Symmetric) | | | y direction (Asymmetric) | | |
| Distance | −x | +x | Difference | −y | +y | Difference |
| 20% | 0.251 | 0.251 | 0 | 0.263 | 0.311 | −0.048 |
| 40% | 1.008 | 1.008 | 0 | 1.135 | 1.172 | −0.037 |
| 60% | 2.286 | 2.286 | 0 | 2.667 | 2.559 | 0.098 |
| 80% | 4.15 | 4.15 | 0 | 4.911 | 4.501 | 0.41 |
| 100% | 6.521 | 6.521 | 0 | 7.878 | 6.966 | 0.912 |

In Table 7, distance is expressed at the % distance to the edge of the active area from the geometric CP. Labels −x, +x, −y and +y refer to the surface elevation of the surface at those positions. The data indicates that, according to this metric, the surface is symmetrical in a first direction but the surface is asymmetric in an orthogonal second direction.

Compared to comparison D1-D4, example A3 (Invention 1) meets all of the aims. In particular, the user would be able to distinguish features in the displayed image that were at least 30 μm wide on the display (see FIG. 6C). Inventive example A3, which has a difference in average surface elevation of 0.123 mm in the second (asymmetric) direction, is within the desired range of asymmetry of 0.85 to 0.150 mm. D1 is totally symmetric and fails to meets the aim visual acuity. As shown in Table 6, D2-D4, all of which are freeform and asymmetric, are all outside the desired range of asymmetry (according to a difference in average surface elevation deviations) and fail to provide the aim visual acuity.

All of these experimental examples show that an asymmetric design for reflective surfaces of 9A1 and 9A2 is necessary to enable the use of a display of the indicated size and pixel spacing. In turn, having a display of the indicated size and pixel spacing allows the AR system to achieve the necessary amount of light emission to have good daylight visibility. In addition, the asymmetric design of the reflective surfaces allows for a low tilt angle (e.g. <20 deg) that limits aberrations and is set at a distance from the eye which makes the system unobtrusive and robust to misalignment between the head and visor. Display sizes and pixel spacing that aren't in the indicated ranges fail to provide the desired performance by themselves and require the use of asymmetric reflective surfaces of a certain type in the visor In the above description, reference is made to the accompanying drawings that form a part hereof, and in which are shown by way of illustration specific embodiments which may be practiced. These embodiments are described in detail to enable those skilled in the art to practice the invention, and it is to be understood that other embodiments may be utilized and that structural, logical and electrical changes may be made without departing from the scope of the present invention. The description of any example embodiments is, therefore, not to be taken in a limiting sense. Although the present invention has been described for the purpose of illustration, it is understood that such detail is solely for that purpose and variations can be made by those skilled in the art without departing from the spirit and scope of the invention.

PARTS LIST

1 Augmented Reality (AR) System
2 Bracket
3 Display
5 Fiber Optic Faceplate
5A Straight Portion of Fiber Optic Faceplate
5B Emitting Surface of Second Portion of the Fiber Optic Faceplate
6 Tilt Angle of Display Unit
7 Support Bracket
8 Display Unit formed of Display 3+Faceplate 5
9 Visor
9A Inner Surface of Visor
9B Outer Surface of Visor
9A1, 9A2 Reflective Inner Surfaces or Sections of Visor
10 Tilt Angle of Visor
11 Side Depth of Visor
12 Eye
13 Horizontal Distance between Display Unit and Eye Plane
14A Angle of Principal Light Ray between display unit 8 and Visor 9
14B Angle of Principal Light Ray between Display Unit 8 and Eye 12
15 Distance between Inner Surface 9A and Eye Pupil 12
22 Vertical Width of Visor
24 Vertical Distance between Display and Horizontal Line-of-Sight of Eye
25 Horizontal Width of Visor
26 Distance between Display Units 8 and Reflective Surfaces of 9A1/9A2
30 Reflected Image
17, 19, 21, 23 Imaginary vertical lines
CP Center Point of Optical Surface
AofS Axis of Symmetry; conventionally orientated as vertical (Y or y-y' direction)
AofA Axis of Asymmetry; conventionally orientated as horizontal (X or x-x' direction)

The invention claimed is:

1. A binocular head-mounted augmented reality system (1) comprising:

two identical display units (8), each with a pixelated display (3) with a width of the emitting area in the range of 30 to 45 mm and a height in the range of 25 to less than 40 mm, and a pixel pitch in the range of 15-50 μm, where each display (3) has a planar emissive surface in direct optical contact with a fiber optic faceplate (5) so that an image emitted by the display (3) passes through the faceplate (5) and is emitted at a curved surface (5B) on the opposite end of the faceplate; and a curved semi-transparent visor (9) having two reflective sections (9A1, 9A2) arranged to reflect the emitted image from each display unit (8) towards the eyes (12) so that the reflected images are combined into a single viewed image along with external light passing through the visor (9); and wherein the reflective sections (9A1, 9A2) each have a freeform surface whose surface elevations from a base plane change symmetrically on either side of a center line (AofS) that runs through a center point (CP) in a first direction but changes asymmetrically on either side of a center line (AofA) through the same center point in a second direction which is orthogonal to the first direction.

2. The augmented reality system of claim 1 where the freeform surfaces of the reflective sections (9A1, 9A2) are predominately concave, as viewed from the eye (12), so that in the first direction, the surface elevation increases symmetrically as the distance from either side of the center line (AofS) increases and in the second direction, the surface elevations increase at one rate as the distance from one side of the center line (AofA) increases but increase at a different rate as the distance from the other side of the center line increases.

3. The augmented reality system of claim 2 wherein the freeform reflective surfaces (9A1, 9A2) have, in the second asymmetric direction, a difference in the average surface elevation from the base plane on either side of the center line is in the range of 0.085 to 0.150 mm.

4. The augmented reality system of claim 2 wherein the freeform reflective surfaces of the reflective sections (9A1, 9A2) when described using Zernike Polynomials, have a Z5 coefficient in the range of −0.15 to −0.44 and a Z8 coefficient in the range of 0.067 to 0.202 when the Zernike normalization radius ($R_{NORM}$) is within 5% of $R_{VISOR}$.

5. The augmented reality system of claim 1 where a horizontal distance (13) between the closest point of the display unit (8) and a vertical line (19) that extends from the front of the eye (12) is in the range of 10-30 mm.

6. The augmented reality system of claim 1 where a vertical distance (24) between the closest point of the display unit (8) and the horizontal line-of-sight of the eye (12) is in the range of 8-20 mm.

7. The augmented reality system of claim 1 where a tilt angle (6) of the display unit (8) is in the range of −5 to 20 degrees.

8. The augmented reality system of claim 7 where the angle (14A) between the principal light-ray from the display unit (8) towards the visor and a line perpendicular to the display is in the range of 10 to 40 degrees.

9. The augmented reality system of claim 1 where a distance (26) between the center point of the display units (8) to the center point of the reflective sections of the visor (9A1, 9A2) is in the range of 35-65 mm.

10. The augmented reality system of claim 1 where a distance (15) between the eye (12) and the reflective sections (9A1, 9A2) of the visor (9) is in the range of 40-90 mm.

11. The augmented reality system of claim 1 where an optical pathlength, which is the sum of the distance (26) between the center point of the display units (8) to the center point of the corresponding reflective section of the visor (9A1, 9A2) and the distance (15) between the center points of the reflective sections of the visor (9A1, 9A2) to the eyes (12), is in the range of 90-130 mm.

12. The augmented reality system of claim 11 where the angle (14B) that is formed between the principal light-ray along the distance from the display unit (8) to the reflective sections of the visor (9A1, 9A2) and from the reflective sections (9A1, 9A2) to the eye (12) is in the range of 20 to 50 degrees.

13. The augmented reality system of claim 12 where the tilt angle (10) of the visor (9) is in the range of 10-25 degrees.

14. The system of claim 1 wherein the fiber optic faceplate (5) has a first straight portion (5A) with a thickness in the range of 0.7 to 1.0 mm, as measured along its vertical walls above the surface of the display (3), and a second portion with the curved emitting surface (5B) with a maximum thickness above the first portion (5A) in the range of 0.8-14 mm.

15. The augmented reality system of claim 1 where the display (3) is an OLED display.

16. The augmented reality system of claim 15 where the OLED display comprises common light-emitting layers that emit white light across the emission area and a color filter array.

17. The augmented reality system of claim 16 where the OLED display has at least two light-emitting units that are separated by a charge-generating layer.

18. The augmented reality system of claim 15 where the OLED display has separate red, green and blue light-emitting pixels.

19. The augmented reality system of claim 1 where the display (3) is a LED display.

20. The augmented reality system of claim 1 where the combined reflected image has a horizontal field-of-view of greater than 40 degrees and a vertical field-of-view of greater than 25 degrees.

* * * * *